United States Patent
Kumon et al.

(10) Patent No.: US 8,828,144 B2
(45) Date of Patent: Sep. 9, 2014

(54) PROCESS FOR CLEANING WAFERS

(75) Inventors: Soichi Kumon, Matsusaka (JP); Takashi Saio, Suzuka (JP); Shinobu Arata, Matsusaka (JP); Masanori Saito, Matsusaka (JP); Hidehisa Nanai, Toshima-ku (JP); Yoshinori Akamatsu, Matsusaka (JP)

(73) Assignee: Central Grass Company, Limited, Ube-shi (JP)

( * ) Notice: Subject to any disclaimer, the term of this patent is extended or adjusted under 35 U.S.C. 154(b) by 144 days.

(21) Appl. No.: 13/350,007

(22) Filed: Jan. 13, 2012

(65) Prior Publication Data

US 2012/0211025 A1    Aug. 23, 2012

Related U.S. Application Data

(63) Continuation-in-part of application No. 13/032,308, filed on Feb. 22, 2011, now abandoned.

(30) Foreign Application Priority Data

Dec. 28, 2010 (JP) ................................. 2010-293853
Oct. 31, 2011 (JP) ................................. 2011-238623
Dec. 15, 2011 (JP) ................................. 2011-274084

(51) Int. Cl.
*H01L 21/00* (2006.01)
*H01L 21/02* (2006.01)

(52) U.S. Cl.
CPC .............................. *H01L 21/02057* (2013.01)
USPC .......................................... 134/1.1; 438/753

(58) Field of Classification Search
USPC ............................................ 438/745; 134/1.1
See application file for complete search history.

(56) References Cited

U.S. PATENT DOCUMENTS

| 5,326,672 | A | 7/1994 | Tanaka et al. |
| 5,374,502 | A | 12/1994 | Tanaka et al. |
| 2008/0039355 | A1* | 2/2008 | Katano et al. ................. 510/407 |
| 2009/0192065 | A1 | 7/2009 | Korzenski et al. |
| 2009/0311874 | A1 | 12/2009 | Tomita et al. |
| 2010/0075504 | A1 | 3/2010 | Tomita et al. |
| 2010/0122711 | A1 | 5/2010 | Ryan |
| 2010/0240219 | A1 | 9/2010 | Tomita et al. |

FOREIGN PATENT DOCUMENTS

| JP | 5-299336 A | 11/1993 |
| JP | 2001-300454 A | 10/2001 |
| JP | 2008-198958 A | 8/2008 |
| JP | 2008-547050 A | 12/2008 |

(Continued)

OTHER PUBLICATIONS

Co-pending U.S. Appl. No. 12/898,185.

(Continued)

*Primary Examiner* — Richard Booth
(74) *Attorney, Agent, or Firm* — Crowell & Moring LLP

(57) ABSTRACT

A process for cleaning a wafer having an uneven pattern at its surface. The process includes at least the steps of: cleaning the wafer with a cleaning liquid; substituting the cleaning liquid retained in recessed portions of the wafer with a water-repellent liquid chemical after cleaning; and drying the wafer, wherein the cleaning liquid contains 80 mass % or greater of a solvent having a boiling point of 55 to 200° C., and wherein the water-repellent liquid chemical supplied in the substitution step has a temperature of not lower than 40° C. and lower than a boiling point of the water-repellent liquid chemical thereby imparting water repellency at least to surfaces of the recessed portions.

8 Claims, 2 Drawing Sheets

(56) References Cited

FOREIGN PATENT DOCUMENTS

| | | |
|---|---|---|
| JP | 4403202 B1 | 11/2009 |
| JP | 2010-114467 A | 5/2010 |
| JP | 2010-129932 A | 6/2010 |
| JP | 2010-192878 A | 9/2010 |
| JP | 2010-192879 A | 9/2010 |
| JP | 2010-272852 A | 12/2010 |
| WO | WO 2010/047196 A1 | 4/2010 |
| WO | WO 2010/074134 A1 | 7/2010 |

OTHER PUBLICATIONS

Co-pending U.S. Appl. No. 12/882,898.
Japanese Industrial Standard JIS R 3257, 1999, Testing method of wettability of glass substrate surface, Mar. 20, 2011, (fifteen (15) pages).
Form PCT/ISA/237 (three (3) pages).
International Search Report with English translation dated Apr. 3, 2012 (five (5) pages).

* cited by examiner

PROCESS FOR CLEANING WAFERS

BACKGROUND OF THE INVENTION

The present invention relates to a technique of cleaning a substrate (a wafer) in production of semiconductor devices or the like.

Semiconductor devices for use in networks or digital household electric appliances are being further desired to be sophisticated, multifunctional, and low in power consumption. Accordingly, the trend toward micro-patterning for circuits has been developed, with which micro-sizing of particles has so advanced as to cause reduction in production yield. As a result of this, a cleaning step for the purpose of removing contaminants such as the micro-sized particles and the like is frequently used. As a result of this, 30-40% of the whole of the semiconductor fabrication process is occupied with the cleaning step.

On the other hand, at the time of cleaning as conventionally performed with an ammonia-mixed cleaning agent, damages to a wafer due to the basicity has been getting serious together with the trend toward micro-patterning for circuits. Therefore, alternation with a less damaging one, i.e., a dilute hydrofluoric acid-based cleaning agent is taking place.

With this, problems about the damages to the wafer due to cleaning have been solved; however, problems due to an aspect ratio increased with the trend toward micro-processing in the semiconductor devices have become obvious. In other words, a phenomenon where the pattern causes a collapse when a gas-liquid interface passes through the pattern is brought about after cleaning or rinsing so as to largely reduce the yield, which has become a significant problem.

DESCRIPTION OF RELATED ART

In Patent Publication 1, there is disclosed a technique of changing a cleaning liquid from water to 2-propanol before a gas-liquid interface passes through a pattern, as a method of suppressing the pattern collapse. However, it is said that there are limitations, for example, such a limitation that an aspect ratio of a pattern adaptable thereto is not higher than 5.

Additionally, in Patent Publication 2, there is disclosed a technique directed toward a resist pattern as a method for suppressing the pattern collapse. This is a method of decreasing a capillary force as far as possible thereby suppressing the pattern collapse. However, the thus disclosed technique is directed toward the resist pattern and is for reforming a resist itself. Moreover, it can be finally removed together with the resist, so that it is not necessary to estimate a process of removing a treatment agent after drying; therefore, this technique cannot be applied to the present object.

Additionally, as a method of preventing the pattern collapse of semiconductor devices, there are suggested the use of a critical fluid, the use of liquid nitrogen and the like. In Patent Publication 3, a process for removing hardened photoresist, post-etch residue, and/or bottom anti-reflective coating (BARC) from a microelectronic device having the hardened photoresist, the post-etch residue, and/or the bottom anti-reflective coating (BARC) thereon is disclosed. The process includes a step of bringing the microelectronic device into contact with a dense fluid concentrate for sufficient time and under sufficient contacting conditions to at least partially remove the hardened photoresist, the post-etch residue, and/ or BARC from the microelectronic device having the photoresist, the residue, and/or BARC thereon, in which the dense fluid concentrate contains at least one kind of co-solvent, optionally at least one kind of oxidizer/radical source, optionally at least one kind of surfactant, and optionally at least one kind of silicon-containing layer passivating agent, and in which the concentrate is further characterized by containing at least one of the following components (I) or (II);
(I) at least one kind of fluoride source and optionally at least one acid; and
(II) at least one kind of acid.
However, this process requires a specific cleaning device as compared to conventional cleaning steps, and difficult to apply to mass production because of its poor throughput and the like.

There is set forth in Patent Publications 4 and 5 a cleaning process for: surface-reforming a wafer surface provided to have an uneven pattern by a film containing silicon, by oxidation or the like; forming a water-repellent film on the surface by using a water-soluble surfactant or a silane coupling agent; reducing the capillary force; and thereby preventing the pattern collapse.

In Patent Publications 6 and 7, there is disclosed a surface treatment process including: a step of treating a surface of a resin pattern formed on a substrate or an etched pattern formed on the substrate by etching with a surface treatment liquid containing a silylation agent and a solvent; and a step of cleaning the resin pattern or the etched pattern obtained after the treatment with the surface treatment liquid.

Patent Publication 8 sets forth a cleaning process for semiconductor devices, the process including: a step of forming a semiconductor device comprised of a substrate and a dielectric layer having features protruding from the substrate; a step of cleaning the features of the semiconductor device with an aqueous solution; a step of replacing the aqueous solution with a first solvent after the cleaning; and a step of treating the features with a second solvent containing a hydrophobic treatment agent that reacts with sidewalls of the features to form a hydrophobic layer on surfaces of the sidewalls.

There is disclosed in Patent Publication 9 a process of cleaning a surface of a silicon wafer, the process using a cleaning agent for a silicon wafer which has a fine recess/ projection pattern in the surface. The cleaning agent contains a cleaning liquid A and a cleaning liquid B. The cleaning liquid A is composed of an aqueous solution. The cleaning liquid B is used for providing recesses in the recess/projection pattern with water repellency, and is obtained by mixing water or an acidic aqueous solution with an alcohol solution which contains an alcohol solvent and a water-repellent compound containing a hydrophobic group and a hydrolyzable moiety which enables formation of a unit that is chemically bondable with silicon element of the silicon wafer. The water-repellent compound is blended to be 0.2-20% by mass per 100% by mass of the total of the cleaning liquid B, thereby providing a water-repellent cleaning liquid. With this, it is possible to present a capillary force of not higher than 2.1 $MN/m^2$ on the assumption that water is retained in the recesses formed at the surface of the silicon wafer provided with water repellency by the cleaning liquid B.

In Patent Publication 10, there is set forth a process of cleaning a surface of a silicon wafer having a fine uneven pattern at the surface, the process using a cleaning agent for the silicon wafer. The cleaning agent includes: at least a water-based cleaning liquid, and a water-repellent cleaning liquid for making at least recessed portions of the uneven pattern water-repellent during a cleaning step. The water-repellent cleaning liquid is a liquid composed of a water-repellent compound containing a reactive moiety which can chemically bind with silicon element of the silicon wafer, and a hydrophobic group, or is a liquid wherein 0.1 mass % or more of the water-repellent compound relative to the total quantity of 100 mass % of the water-repellent cleaning liquid and an organic solvent are mixed and contained therein, thereby achieving a capillary force of not higher than 2.1 $MN/m^2$ on the assumption that water is retained in the recessed portions formed at the surface of the silicon wafer provided with water repellency by the water-repellent cleaning liquid.

In Patent Publication 11, there is disclosed a process of cleaning a surface of a silicon wafer having a fine uneven pattern on the surface, the process using a cleaning agent for the silicon wafer. The cleaning agent for the silicon wafer includes at least a water-based cleaning liquid, and a water-repellent cleaning liquid for making at least recessed portions of the uneven pattern water-repellent during a cleaning step. The water-repellent cleaning liquid is a liquid mixedly containing a water-repellent compound which contains a reactive moiety which can chemically bind with silicon element of the silicon wafer and a hydrophobic group, and an organic solvent containing a nitrogen element-containing solvent. The water-repellent compound is mixedly contained at 0.1-50 mass % relative to the total quantity of 100 mass % of the water-repellent cleaning liquid. Furthermore, in the nitrogen element-containing solvent, an element bound to nitrogen is carbon. This allows presenting a capillary force of not higher than 2.1 $MN/m^2$ on the assumption that water is retained in the recessed portions formed at the surface of the silicon wafer provided with water repellency by the water-repellent cleaning liquid.

In Patent Publication 12, there is disclosed a process of cleaning a surface of a silicon wafer having a fine uneven pattern on the surface, the process using a cleaning agent for the silicon wafer. The cleaning agent for the silicon wafer is characterized by containing: at least an aqueous cleaning liquid; and a water-repellent cleaning liquid for providing at least recessed portions in the uneven pattern with water repellence during a cleaning step. The water-repellent cleaning liquid contains a mixture of a water-repellent compound which contains a hydrophobic group and a reactive moiety that is chemically bondable with silicon element of the silicon wafer, and an organic solvent that contains at least an alcohol solvent.

Hitherto, there has generally been used a wafer containing silicon element at its surface; however, a wafer containing at its surface an element such as titanium, tungsten, aluminum, copper, tin, tantalum and ruthenium has become used together with the diversification of the pattern. There is disclosed in Patent Publication 13 that it is possible to improve a cleaning step which tends to induce a wafer to cause the pattern collapse, by using a liquid chemical including a water-repellent-protecting-film-forming agent. The water-repellent-protecting-film-forming agent is provided for forming a water-repellent protecting film on a wafer when cleaning the wafer, the wafer having at its surface an uneven pattern and containing at least one kind of substance selected from the group consisting of titanium, titanium nitride, tungsten, aluminum, copper, tin, tantalum nitride, ruthenium and silicon at least a part of surfaces of recessed portions of the uneven pattern, the water-repellent protecting film being formed at least on the surfaces of the recessed portions.

Patent Publication 1: Japanese Patent Application Publication No. 2008-198958
Patent Publication 2: Japanese Patent Application Publication No. 5-299336
Patent Publication 3: Japanese Patent Application Publication No. 2008-547050
Patent Publication 4: Japanese Patent No. 4403202
Patent Publication 5: Japanese Patent Application Publication No. 2010-114467
Patent Publication 6: Japanese Patent Application Publication No. 2010-129932
Patent Publication 7: International Application Publication 2010/047196 Pamphlet
Patent Publication 8: U.S. Patent Application Publication No. 2010/0122711
Patent Publication 9: International Application Publication 2010/074134 Pamphlet
Patent Publication 10: Japanese Patent Application Publication No. 2010-192878
Patent Publication 11: Japanese Patent Application Publication No. 2010-192879
Patent Publication 12: Japanese Patent Application Publication No. 2010-272852
Patent Publication 13: Japanese Patent No. 4743340

SUMMARY OF THE INVENTION

The present invention relates to a technique for cleaning a substrate (a wafer) in semiconductor device manufacturing and the like, the objective of which is to improve the production yield of devices having such a circuit pattern as to be particularly fine and particularly high in aspect ratio, and more particularly to a water-repellent liquid chemical and the like with the objective of improving a cleaning step which tends to induce a wafer having an uneven pattern at its surface to cause a collapse. Patent Publications 4 and 5 disclose that the liquid temperature is increased by annealing treatment thereby accelerating a reaction of a surface treatment agent, but take it into account neither to quickly spread the surface treatment agent over the surface of an article to be treated nor to so accelerate the reaction of the surface treatment agent as to sufficiently form a coating even under an incompletely substituted condition, i.e., even under a condition where substitution is not completely achieved. Therefore, these have been susceptible to improvement in shortening the time involved in surface treatment. Additionally, Patent Publications 6 to 13 also have been susceptible to improvement in shortening the time involved in surface treatment, for the same reason. The present invention is a process for cleaning a wafer, in which a water-repellent film is formed at least on surfaces of recessed portions of the wafer so as to reduce interaction between a liquid retained in the recessed portions and the surfaces of the recessed portions, thereby contributing to the prevention of the collapse of an uneven pattern. The present invention aims to provide a cleaning process which enables to economically and efficiently clean the wafer without impairing throughput.

A process for cleaning a wafer, according to the present invention is a process for cleaning a wafer having an uneven pattern at its surface, comprising at least the steps of:
   cleaning the wafer with a cleaning liquid;
   substituting the cleaning liquid retained in recessed portions of the wafer with a water-repellent liquid chemical after cleaning; and
   drying the wafer,
   wherein the cleaning liquid comprises 80 mass % or greater of a solvent having a boiling point of 55 to 200° C., and
   wherein the water-repellent liquid chemical supplied in the substitution step has a temperature of not lower than 40° C. and lower than a boiling point of the water-repellent liquid chemical thereby imparting water repellency at least to surfaces of the recessed portions. In this specification, incidentally, a boiling point refers to a value indicated at 1 atmospheric pressure. Moreover, a boiling point of the water-repellent liquid chemical refers to a boiling point of a component the amount of which is the largest in mass ratio among components of the water-repellent liquid chemical.

A pattern collapse occurs due to a gas-liquid interface that passes through a pattern when the wafer is dried, after cleaning the wafer with a cleaning liquid. The reason thereof is said that a difference in height of residual liquid of the cleaning liquid between a large-aspect ratio portion and a small-aspect ratio portion causes a difference in capillary force which acts on the pattern.

Accordingly, it is expected by decreasing the capillary force that the difference in capillary force due to the difference in height of residual liquid is reduced thereby resolving the pattern collapse. The magnitude of the capillary force is the absolute value of P obtained by the equation as represented below. From this equation, it is expected that the capillary force can be reduced by decreasing $\gamma$ or $\cos \theta$.

$$P = 2 \times \gamma \times \cos \theta / S$$

(In the equation, $\gamma$ represents the surface tension of a liquid retained in the recessed portions, $\theta$ represents the contact angle between a liquid retained in the recessed portions and the surfaces of the recessed portions, and S represents the widths of the recessed portions.)

The above-mentioned water-repellent liquid chemical can form the water-repellent film at least on the surfaces of the recessed portions of the uneven pattern to decrease a surface energy of the portion, thereby reducing the interaction between water or another liquid and the surface of the portion (i.e., at the interface), such as hydrogen bond, intermolecular forces and the like. The effect of reducing the interaction against water in particular is outstanding, but the effect of reducing the interaction is exhibited also in the case of a mixture liquid of water and a liquid other than water and in the case of a liquid other than water. With this, it is possible to increase the contact angle of the liquid to an article surface.

As discussed above, the cleaning liquid is substituted with the water-repellent liquid chemical. While the liquid chemical is being retained at least in the recessed portions of the uneven pattern, the water-repellent film is formed at least on the surfaces of the recessed portions of the uneven pattern. In other words, the uneven pattern is coated with the water-repellent film at least on the surfaces of the recessed portions when liquid is removed from or dried out of the recessed portions, so that the capillary force is lowered to make the pattern collapse difficult to occur.

Additionally, in order to form the water-repellent film at least on the surfaces of the recessed portions of the uneven pattern with a short time, it is effective to enhance a film-forming capability of the liquid chemical and to promptly substitute the cleaning liquid retained in the recessed portions with the water-repellent liquid chemical.

When the water-repellent liquid chemical supplied in the substitution step has a temperature of not lower than 40° C., the reaction or adsorption of the water-repellent liquid chemical is accelerated and the film-forming capability is enhanced. As a result, it becomes possible to form the water-repellent film with a short time. Additionally, it becomes possible to sufficiently form the water-repellent film even under an incompletely substituted condition, i.e., even if substitution is not completely accomplished. However, when the water-repellent liquid chemical has a temperature of the boiling point of the liquid chemical, the liquid chemical is immediately evaporable so as to easily bring the surface of the wafer dryness, which is therefore not preferable. Hence the water-repellent liquid chemical is supplied to the surface of the wafer at a temperature of not lower than 40° C. and lower than the boiling point of the water-repellent liquid chemical, preferably at a temperature of not lower than 50° C. and lower than a temperature represented by (the boiling point of the water-repellent liquid chemical—10° C.), more preferably at a temperature of not lower than 70° C. and lower than a temperature represented by (the boiling point of the water-repellent liquid chemical—10° C.).

Additionally, when the cleaning liquid is one containing 80 mass % or greater of a solvent having a boiling point of 55 to 200° C., the cleaning liquid can readily evaporate at the time of supplying a water-repellent liquid chemical having a temperature of not lower than 40° C., so that the cleaning liquid retained in the recessed portions can be readily substituted with the water-repellent liquid chemical with a short time. As a result of this, it becomes possible to form the water-repellent film with a short time. Furthermore, when the liquid chemical to be supplied has a temperature of not lower than 40° C. and lower than the boiling point of the liquid chemical, diffusion and convection tend to occur against the cleaning liquid that had been retained in the recessed portions of the uneven pattern, with which it becomes possible to substitute the cleaning liquid with the water-repellent liquid chemical with a short time. Therefore, the cleaning liquid is particularly preferably one containing 80 mass % or greater of a solvent having a boiling point of 60 to 180° C., much more preferably one containing 80 mass % or greater of a solvent having a boiling point of 70 to 160° C. By the way, when the cleaning liquid is one containing 80 mass % or greater of a solvent having a boiling point of lower than 55° C., there may be a case where the cleaning liquid causes bumping at the time of supplying a liquid chemical having a temperature of not lower than 40° C. and lower than the boiling point of the water-repellent liquid chemical in the course of the step of substituting the cleaning liquid with the water-repellent liquid chemical, or a case where the evaporation rate of the cleaning liquid becomes too fast. As a result, air bubbles or bumping may cause damages to the uneven pattern. Additionally, when the cleaning liquid is one containing 80 mass % or greater of a solvent having a boiling point of higher than 200° C., evaporation of the cleaning liquid is slow at the time of supplying a liquid chemical having a temperature of not lower than 40° C. and lower than the boiling point of the water-repellent liquid chemical in the course of the step of substituting the cleaning liquid with the water-repellent liquid chemical. Hence it tends to take a long period of time for substitution, and therefore it tends to take a long period of time to exhibit water repellency on the surface of the wafer. Incidentally, it is preferable to use a solvent having a boiling point of 55 to 200° C. as the cleaning liquid because temperature control on the water-repellent liquid chemical, made in order to prevent the cleaning liquid from abrupt evaporation, air bubbles and bumping, is readily performed.

The cleaning liquid is preferably at least one liquid selected from the group consisting of; organic solvents; water; and aqueous solutions obtained by mixing at least one kind selected from the organic solvents, acids, alkalis and oxidizing agents with water. Incidentally, water and the aqueous solutions obtained by mixing at least one kind selected from the group consisting of organic solvents, acids, alkalis and oxidizing agents with water may hereinafter be referred to as a water-based liquid.

The water-repellent liquid chemical is used in the process for cleaning a wafer formed having an uneven pattern in such a manner as to substitute the cleaning liquid with the liquid chemical. Additionally, the substituted water-repellent liquid chemical may be substituted with another cleaning liquid.

It is not necessary for the water-repellent film to be formed continuously and uniformly; however, it is preferable to form it continuously and uniformly because a more excellent water repellency is obtained.

It is preferable that the above-mentioned wafer is a wafer containing silicon element at the surfaces of the recessed portions of the uneven pattern (hereinafter it may be referred to as "a silicon-based wafer"), and that the water-repellent liquid chemical is one containing a silicon compound A represented by the following general formula [1]; or one containing the silicon compound A, and an acid or a base. Moreover, a process for cleaning the silicon-based wafer with a water-repellent liquid chemical for silicon-based wafers will be referred to as a first embodiment of the present invention (hereinafter it may be referred to as "a first process"). Incidentally, the above-mentioned liquid chemical may be referred to as "a water-repellent liquid chemical for silicon-based wafers".

$$(R^1)_a Si(H)_b X^1_{4-a-b}$$ [1]

[In the formula [1], $R^1$ mutually independently represents a monovalent organic group having a $C_1$-$C_{18}$ monovalent hydrocarbon group the hydrogen elements of which may partially or entirely be replaced with a fluorine element(s). Additionally, $X^1$ mutually independently represents at least one group selected from the group consisting of a monovalent functional group of which element to be bonded to silicon element is nitrogen, a monovalent functional group of which element to be bonded to silicon element is oxygen, a halogen group, nitrile group and —CO—NH—Si(CH$_3$)$_3$ group. a is an integer of from 1 to 3. b is an integer of from 0 to 2. The total of a and b is 1 to 3.]

Furthermore, it is preferable that the water-repellent liquid chemical contains acid and that the acid is at least one selected from the group consisting of hydrogen chloride, sulfuric acid, perchloric acid, phosphoric acid, sulfonic acid represented by the following general formula [2] and its anhydride, carboxylic acid represented by the following general formula [3] and its anhydride, alkyl borate ester, aryl borate ester, boron tris(trifluoroacetate), trialkoxyboroxin, boron trifluoride and a silicon compound B represented by the following general formula [4].

$$R^2S(O)_2OH$$ [2]

[In the formula [2], $R^2$ represents a $C_1$-$C_{18}$ monovalent hydrocarbon group the hydrogen elements of which may partially or entirely be replaced with a fluorine element(s).]

$$R^3COOH$$ [3]

[In the formula [3], $R^3$ represents a $C_1$-$C_{18}$ monovalent hydrocarbon group the hydrogen elements of which may partially or entirely be replaced with a fluorine element(s).]

$$(R^4)_c Si(H)_d X^2_{4-c-d}$$ [4]

[In the formula [4], $R^4$ mutually independently represents a $C_1$-$C_{18}$ monovalent hydrocarbon group the hydrogen elements of which may partially or entirely be replaced with a fluorine element(s). Additionally, $X^2$ mutually independently represents at least one group selected from the group consisting of chloro group, —OCO—$R^5$ ($R^5$ is a $C_1$-$C_{18}$ monovalent hydrocarbon group the hydrogen elements of which may partially or entirely be replaced with a fluorine element(s).) and —OS(O)$_2$—$R^6$ ($R^6$ is a $C_1$-$C_{18}$ monovalent hydrocarbon group the hydrogen elements of which may partially or entirely be replaced with a fluorine element(s).). c is an integer of from 1 to 3. d is an integer of from 0 to 2. The total of c and d is 1 to 3.]

It is preferable that the acid is the silicon compound B represented by the following general formula [4] and that the acid is at least one selected from the group consisting of trimethylsilyl trifluoroacetate, trimethylsilyl trifluoromethanesulfonate, dimethylsilyl trifluoroacetate, dimethylsilyl trifluoromethanesulfonate, butyldimethylsilyl trifluoroacetate, butyldimethylsilyl trifluoromethanesulfonate, hexyldimethylsilyl trifluoroacetate, hexyldimethylsilyl trifluoromethanesulfonate, octyldimethylsilyl trifluoroacetate, octyldimethylsilyl trifluoromethanesulfonate, decyldimethylsilyl trifluoroacetate, decyldimethylsilyl trifluoromethanesulfonate, do decyldimethylsilyl trifluoroacetate and dodecyldimethylsilyl trifluoromethanesulfonate.

Additionally, it is preferable that the water-repellent liquid chemical contains a base and that the base is at least one selected from the group consisting of ammonia, N,N,N',N'-tetramethylethylenediamine, triethylenediamine, dimethylaniline, alkylamine, dialkylamine, trialkylamine, pyridine, piperazine, N-alkylmorpholine and a silicon compound C represented by the following general formula [5].

$$(R^7)_e Si(H)_f X^3_{4-e-f}$$ [5]

[In the formula [5], $R^7$ mutually independently represents a $C_1$-$C_{18}$ monovalent hydrocarbon group the hydrogen elements of which may partially or entirely be replaced with a fluorine element(s). Additionally, $X^3$ mutually independently represents a monovalent functional group of which element to be bonded to silicon element is nitrogen, the monovalent functional group possibly containing a fluorine element or a silicon element. e is an integer of from 1 to 3. f is an integer of from 0 to 2. The total of e and f is 1 to 3.]

The water-repellent film formed by using the water-repellent liquid chemical for silicon-based wafers is formed by reacting $X^1$ represented in the above-mentioned general formula [1] with silanol group that serves as a reaction site of the surface of the silicon-based wafer the wafer surface thereby chemically bonding the silicon compound A to silicon element of the silicon-based wafer. $R^1$ shown in the above-mentioned general formula [1] decreases a surface energy of the recessed portions so as to reduce the interaction between water or another liquid and the surface of the water-repellent film (i.e., at the interface), such as hydrogen bond, intermolecular forces and the like, thereby allowing increasing the contact angle of liquid to an article surface.

The acid or the base, which may be contained in the liquid chemical, contributes to acceleration of the reaction between the silicon compound A and silicon element of the silicon-based wafer. The presence of the acid or the base in the water-repellent liquid chemical for silicon-based wafers makes it possible to form a water-repellent film with a short time. Incidentally, the rate of forming the water-repellent film on the surface of the silicon-based wafer, i.e. the rate at which the surface of the silicon-based wafer exhibits water repellency is determined by the rate at which a component derived from the silicon compound A is bonded to the reaction site of the surface of the silicon-based wafer. In the presence of the acid or the base, the component derived from the silicon compound A can be rapidly reacted with silanol group serving as the reaction site of the unevenly patterned surface of the silicon-based wafer, so that water repellency is sufficiently provided to the surface of the silicon-based wafer with a short time during surface treatment. Incidentally, the acid or the base may constitute a part of the water-repellent film.

Additionally, it is preferable that the silicon compound A is at least one selected from the group consisting of hexamethyldisilazane, trimethylsilyl dimethylamine, trimethylsilyl diethylamine, tetramethyldisilazane, dimethylsilyl dimethylamine, dimethylsilyl diethylamine, 1,3-dibutyltetramethyldisilazane, butyldimethylsilyl dimethylamine, butyldimethylsilyl diethylamine, 1,3-dihexyltetramethyldisilazane, hexyldimethylsilyl dimethylamine, hexyldimethylsilyl diethylamine, 1,3-dioctyltetramethyldisilazane, octyldimethylsilyl dimethylamine, octyldimethylsilyl diethylamine, 1,3-didecyltetramethyldisilazane, decyldimethylsilyl dimethylamine, decyldimethylsilyl diethylamine, 1,3-didodecyltetramethyldisilazane, dodecyldimethylsilyl dimethylamine and dodecyldimethylsilyl diethylamine.

Moreover, it is preferable that the wafer is a wafer containing at least one kind of element of titanium, tungsten, aluminum, copper, tin, tantalum and ruthenium (hereinafter these may be referred to as "metal-based elements") at the surfaces of the recessed portions of the uneven pattern (hereinafter the wafer may be referred to as "a metal-based wafer") and that the water-repellent liquid chemical is one containing: at least one kind selected from the group consisting of compounds represented by the following general formulas [6] to [12] and salt compounds thereof; and a solvent. Incidentally, the above-mentioned liquid chemical may be referred to as "a water-repellent liquid chemical for metal-based wafers". Additionally, a process for cleaning the metal-based wafer with a water-repellent liquid chemical for metal-based wafers will be referred to as a second embodiment of the present invention (hereinafter it may be referred to as "a second process").

$$R^8—P(=O)—(OH)_g(R^9)_{2-g} \quad [6]$$

[In the formula [6], $R^8$ represents a $C_1$-$C_{18}$ monovalent hydrocarbon group the hydrogen elements of which may partially or entirely be replaced with a fluorine element(s). $R^9$ mutually independently represents a monovalent organic group having a $C_1$-$C_{18}$ hydrocarbon group the hydrogen elements of which may partially or entirely be replaced with a fluorine element(s). g is an integer of from 0 to 2.]

$$R^{10}—C(=O)—X^4 \quad [7]$$

[In the formula [7], $R^{10}$ represents a monovalent organic group having a $C_1$-$C_{18}$ hydrocarbon group, or a monovalent organic group having a $C_1$-$C_8$ fluoroalkyl chain. $X^4$ represents a group selected from the group consisting of a fluoro group, chloro group, bromo group and iodo group.]

$$R^{11}R^{12}R^{13}N \quad [8]$$

[In the formula [8], $R^{11}$ represents a monovalent organic group having a $C_1$-$C_{18}$ hydrocarbon group, or a monovalent organic group having a $C_1$-$C_8$ fluoroalkyl chain. $R^{12}$ represents a hydrogen element, a monovalent organic group having a $C_1$-$C_{18}$ hydrocarbon group, or a monovalent organic group having a $C_1$-$C_8$ fluoroalkyl chain. $R^{13}$ represents a hydrogen element, a monovalent organic group having a $C_1$-$C_{18}$ hydrocarbon group, or a monovalent organic group having a $C_1$-$C_8$ fluoroalkyl chain.]

$$R^{14}—C(=O)—X^5—X^6 \quad [9]$$

[In the formula [9], $R^{14}$ represents a monovalent organic group having a $C_1$-$C_{18}$ hydrocarbon group, or a monovalent organic group having a $C_1$-$C_8$ fluoroalkyl chain. $X^5$ represents an oxygen element or sulfur element. $X^6$ represents a group selected from the group consisting of a hydrogen element, alkyl group, aromatic group, pyridyl group, quinolyl group, succinimide group, maleimide group, benzoxazole group, benzothiazole group and benzotriazole group; a hydrogen element(s) of these groups may be substituted with an organic group.]

$$R^{15}(X^7)_h \quad [10]$$

[In the formula [10], $X^7$ mutually independently represents at least one group selected from the group consisting of an isocyanate group, mercapto group, aldehyde group, —CONHOH group and cyclic structure containing a nitrogen element. h is an integer of from 1 to 6. $R^{15}$ represents an organic group having a $C_1$-$C_{18}$ hydrocarbon group, or an organic group having a $C_1$-$C_8$ fluoroalkyl chain. This is a compound formed by substituting the "h" number of group(s) selected from an isocyanate group, mercapto group, aldehyde group, —CONHOH group and cyclic structure containing a nitrogen element for the same number of hydrogen element(s).]

$$R^{16}—X^8 \quad [11]$$

[In the formula [11], $X^8$ represents a cyclic structure containing a sulfur element. $R^{16}$ represents a hydrogen element, a monovalent organic group having a $C_1$-$C_{18}$ hydrocarbon group, or a monovalent organic group having a $C_1$-$C_8$ fluoroalkyl chain.]

$$R^{17}—C(=O)—X^9—C(=O)—R^{18} \quad [12]$$

[In the formula [12], $R^{17}$ represents a monovalent organic group having a $C_1$-$C_{18}$ hydrocarbon group, or a monovalent organic group having a $C_1$-$C_8$ fluoroalkyl chain. $R^{18}$ represents a monovalent organic group having a $C_1$-$C_{18}$ hydrocarbon group, or a monovalent organic group having a $C_1$-$C_8$ fluoroalkyl chain. $X^9$ represents an oxygen element or a sulfur element.]

The water-repellent film formed by using the water-repellent liquid chemical for metal-based wafers is formed at least on the surfaces of the recessed portions of the metal-based wafer, by using a compound selected from the compounds represented by the above-mentioned general formulas [6] to [12] and salt compounds thereof. Incidentally, formation of the water-repellent film is accomplished by adsorbing a functional moiety having compatibility with a metal element-containing substance onto a surface of the metal element-containing substance, and/or by reacting the functional moiety with the surface of the substance to form a chemical bond thereby causing adsorption. The above-mentioned functional moiety is: in the general formula [6], a group represented by P—OH group and/or P=O group; in the general formula [7], a group represented by —C(=O)—$X^4$; in the general formula [8], a nitrogen element; in the general formula [9], a group represented by —C(=O)—$X^5$—$X^6$; in the general formula [10], a group represented by $(X^7)_h$; in the general formula [11], a group represented by —$X^8$; and in the general formula [12], a group represented by —C(=O)—$X^9$—C(=O)—. By the way, "having compatibility" means that Van der Waals force, an electrostatic interaction and the like act between the surface of the metal element-containing substance and the functional moiety of the compound. Additionally, $R^8$ of the general formula [6], $R^{10}$ of the general formula [7], $R^{11}$ of the general formula [8], $R^{14}$ of the general formula [9], $R^{15}$ of the general formula [10], $R^{16}$ of the general formula [11] and $R^{17}$ and $R^{18}$ of the general formula [12] are hydrophobic moieties of the above-mentioned compounds. Therefore, when the compound is adsorbed on the metal element of the metal-based wafer, the hydrophobic moieties are arranged outward from the surface of the metal-based wafer. As a result, a surface energy of the recessed portions is decreased thereby providing the effect of reducing the interaction between water or another liquid and the surface of the water-repellent film (i.e., at the interface), such as hydrogen bond, intermolecular forces and the like. With this, it is possible to increase the contact angle of the liquid to an article surface.

Furthermore, the present invention is a water-repellent liquid chemical used in any of the above-mentioned processes for cleaning wafers.

In this specification, in a case of specifying both the silicon-based wafer and the metal-based wafer, they are sometimes referred to merely as "a wafer(s)". Moreover, in a case of specifying both the water-repellent liquid chemical for silicon-based wafers and the water-repellent liquid chemical for metal-based wafers, they are sometimes referred to merely as "a water-repellent liquid chemical(s)".

In the cleaning process of the present invention, a water-repellent film is formed on the surfaces of the recessed portions of the wafer so as to reduce the interaction between a liquid retained in the recessed portions and the surfaces of the recessed portions, with which it is possible to form the water-repellent film contributing to the prevention of the collapse of the uneven pattern, in a short time. Accordingly, the process for producing a wafer formed having an unevenly patterned surface, performed by using the water-repellent liquid chemical of the present invention is excellent in productivity.

DETAILED DESCRIPTION

The present invention is a process for cleaning a wafer having an uneven pattern at its surface, characterized by comprising at least the steps of:
cleaning the wafer with a cleaning liquid;
substituting the cleaning liquid retained in recessed portions of the wafer with a water-repellent liquid chemical after cleaning; and
drying the wafer,
wherein the cleaning liquid comprises 80 mass % or greater of a solvent having a boiling point of 55 to 200° C., and
wherein the water-repellent liquid chemical supplied in the substitution step has a temperature of not lower than 40° C. and lower than a boiling point of the water-repellent liquid chemical thereby imparting water repellency at least to surfaces of the recessed portions.

Figure 1:
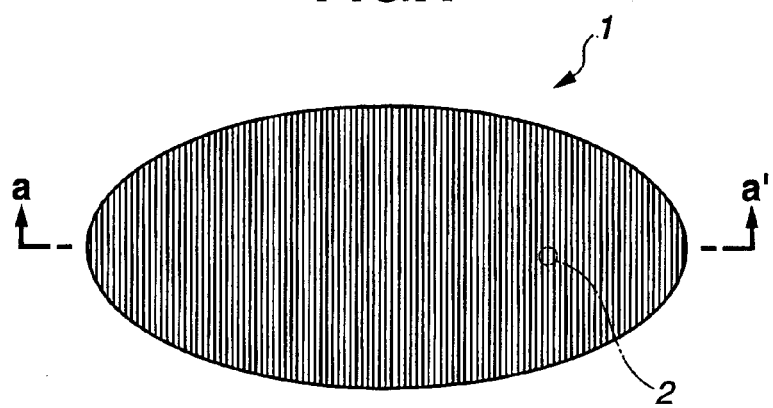
FIG. 1 A schematic plan view showing an example of a wafer 1 whose surface is made into a surface formed having an uneven pattern 2.
Figure 2:
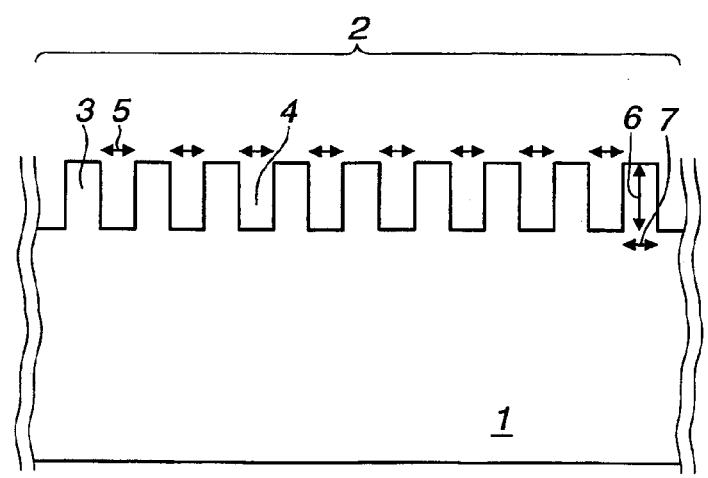
FIG. 2 A view showing a part of a-a' cross section of FIG. 1.

The wafer formed having the uneven pattern at its surface is cleaned with a various kinds of liquids and then the liquids are removed therefrom by drying or the like. If the recessed portions have small widths and projected portions have large aspect ratios, a pattern collapse is to easily occur. The uneven pattern is defined as shown in FIG. 1 and FIG. 2. FIG. 1 is a schematic plan view showing an example of a wafer 1 whose surface is made into a surface formed having an uneven pattern 2. FIG. 2 is a view showing a part of a-a' cross section of FIG. 1. Widths 5 of recessed portions are defined by intervals between adjacent projected portions 3, as shown in FIG. 2. The aspect ratios of projected portions are expressed by dividing heights 6 of the projected portions by widths 7 of the projected portions. The pattern collapse found in the cleaning step is to easily occur when the recessed portions have widths of not more than 70 nm, particularly not more than 45 nm and when the aspect ratios are not less than 4, particularly not less than 6.

In the cleaning process of the present invention, the cleaning liquid containing 80 mass % or greater of a solvent having a boiling point of 55 to 200° C. is retained at least in the recessed portions of the uneven pattern. Then, the cleaning liquid is substituted with the water-repellent liquid chemical under a condition where the cleaning liquid is retained at least in the recessed portions of the uneven pattern.

Figure 3:
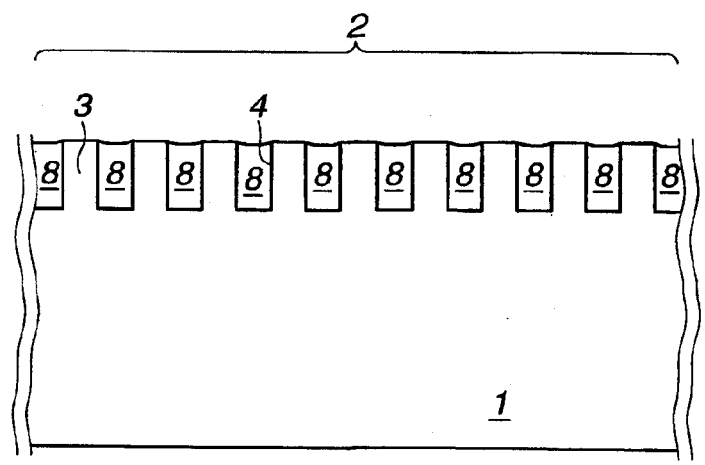
FIG. 3 A schematic view showing a condition where a cleaning liquid 8 is retained in recessed portions 4 in a cleaning step.

FIG. 3 is a schematic view showing a condition where a cleaning liquid 8 is retained in recessed portions 4 in the cleaning step. The wafer drawn in the schematic view of FIG. 3 shows a part of the a-a' cross section in FIG. 1. The water-repellent liquid chemical is supplied to the wafer which is in a condition where the cleaning liquid 8 is retained in the recessed portions 4 in the cleaning step.

Figure 4:
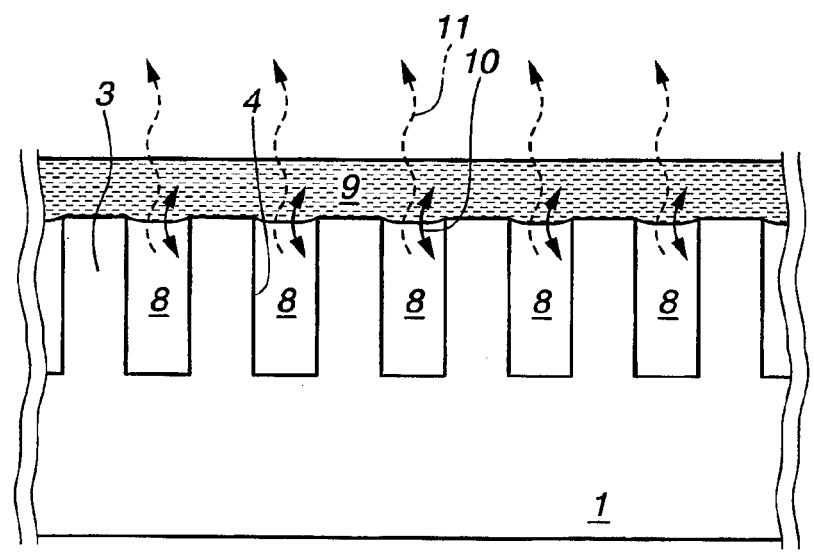
FIG. 4 A schematic view showing a condition where a water-repellent liquid chemical 9 is supplied to the wafer in which the cleaning liquid 8 is retained in the recessed portions 4 in the cleaning step.

FIG. 4 is a schematic view showing a condition where a water-repellent liquid chemical 9 is supplied to the wafer which is in a condition where the cleaning liquid 8 is retained in the recessed portions 4. At this occasion, substitution of the cleaning liquid 8 with the water-repellent liquid chemical 9 progresses; since the cleaning liquid 8 contains 80 mass % or greater of a solvent having a boiling point of 55 to 200° C. and since the water-repellent liquid chemical 9 is heated to be not lower than 40° C. and lower than a boiling point of the water-repellent liquid chemical, mixing of the cleaning liquid and the water-repellent liquid chemical tends to readily proceed by virtue of diffusion or convection as represented by 10 in this figure. Furthermore, evaporation of the cleaning liquid as represented by 11 in this figure becomes readily advanced. As a result, the substitution can be developed in a short time.

Figure 5:
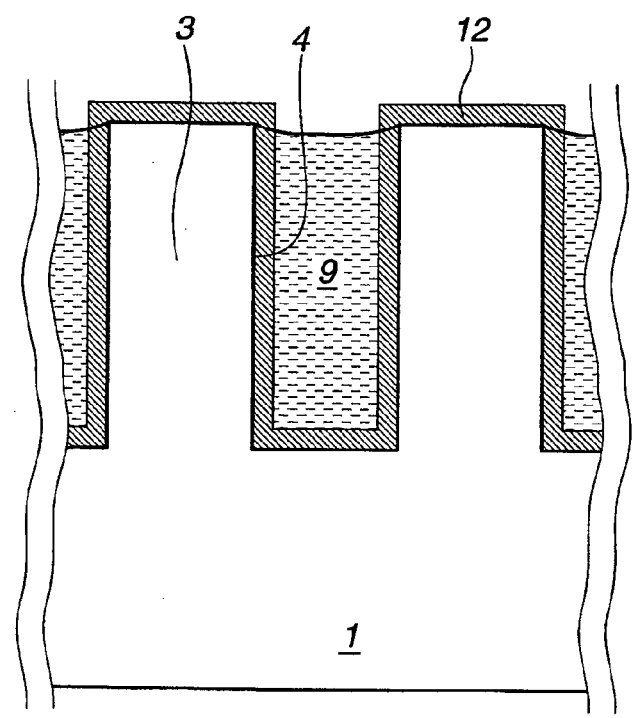
FIG. 5 A schematic view showing a condition where the water-repellent liquid chemical 9 is retained in the recessed portions 4 thereby forming a water-repellent film 12 in a substitution step.

FIG. 5 is a schematic view showing a condition where the water-repellent liquid chemical 9 is retained in the recessed portions 4 so that a water-repellent film 12 is formed in the substitution step. The water-repellent film 12 is formed on the surfaces of the recessed portions 4, with which the surfaces obtain water repellency.

Hereinafter, a first process will be discussed. The water-repellent liquid chemical for silicon-based wafers is preferably one containing a silicon compound A represented by the general formula [1]; or one containing the silicon compound A, and an acid or a base.

In the above-mentioned general formula [1], the monovalent functional group of which element to be bonded to silicon element is nitrogen, which is an example of $X^1$, may include not only a hydrogen, carbon, nitrogen and oxygen element but also a silicon, sulfur and halogen element and the like. Examples of the functional group are an isocyanate group, amino group, dialkylamino group, isothiocyanate group, azide group, acetamide group, —N(CH$_3$)C(O)CH$_3$, —N(CH$_3$)C(O)CF$_3$, —N=C(CH$_3$)OSi(CH$_3$)$_3$, —N=C(CF$_3$)OSi(CH$_3$)$_3$, —NHC(O)—OSi(CH$_3$)$_3$, —NHC(O)—NH—Si(CH$_3$)$_3$, imidazole ring (the following formula [13]), oxazolidinone ring (the following formula [14]), morpholine ring (the following formula [15]), —NH—C(O)—Si(CH$_3$)$_3$, —N(H)$_{2-i}$(Si(H)$_j$R$^{19}$$_{3-j}$)$_i$ (where R$^{19}$ is a C$_1$-C$_{18}$ monovalent hydrocarbon group the hydrogen elements of which may partially or entirely be replaced with a fluorine element(s); i is an integer of 1 or 2; and j is an integer of from 0 to 2) and the like.

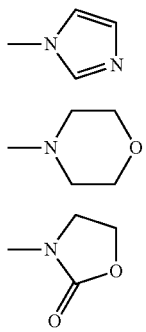

[13]

[14]

[15]

In the above-mentioned general formula [1], the monovalent functional group of which element to be bonded to silicon element is oxygen, which is an example of $X^1$, may include not only a hydrogen, carbon, nitrogen and oxygen element but also a silicon, sulfur and halogen element and the like. Examples of the organic group are an alkoxy group, —OC$(CH_3)$=CHCOCH$_3$, —OC$(CH_3)$=N—Si$(CH_3)_3$, —OC$(CF_3)$=N—Si$(CH_3)_3$, —O—CO—R$^{20}$ (where R$^{20}$ is a $C_1$-$C_{18}$ monovalent hydrocarbon group the hydrogen elements of which may partially or entirely be replaced with a fluorine element(s)), an alkyl sulfonate group the hydrogen elements of which may partially or entirely be replaced with a fluorine element(s), and the like.

Additionally, a halogen group, which is an example of $X^1$ of the general formula [1] is exemplified by a chloro group, bromo group, iodo group and the like.

In addition, $R^1$ of the general formula [1] serves as a hydrophobic moiety which decreases a surface energy of the water-repellent film and reduces the interaction caused between water or another liquid and the surface of the water-repellent film (i.e., at the interface), such as hydrogen bond, intermolecular forces and the like. The effect of reducing the interaction is particularly exhibited with water, but the effect of reducing the interaction is exhibited also with a mixture liquid of water and a liquid other than water or with a liquid other than water. With this, the contact angle of the liquid to the article surface can be increased.

Examples of the silicon compound A represented by the general formula [1] are: alkylmethoxysilanes such as CH$_3$Si(OCH$_3$)$_3$, C$_2$H$_5$Si(OCH$_3$)$_3$, C$_3$H$_7$Si(OCH$_3$)$_3$, C$_4$H$_9$Si(OCH$_3$)$_3$, C$_5$H$_{11}$Si(OCH$_3$)$_3$, C$_6$H$_{13}$Si(OCH$_3$)$_3$, C$_7$H$_{15}$Si(OCH$_3$)$_3$, C$_8$H$_{17}$Si(OCH$_3$)$_3$, C$_9$H$_{19}$Si(OCH$_3$)$_3$, C$_{10}$H$_{21}$Si(OCH$_3$)$_3$, C$_{11}$H$_{23}$Si(OCH$_3$)$_3$, C$_{12}$H$_{25}$Si(OCH$_3$)$_3$, C$_{13}$H$_{27}$Si(OCH$_3$)$_3$, C$_{14}$H$_{29}$Si(OCH$_3$)$_3$, C$_{15}$H$_{31}$Si(OCH$_3$)$_3$, C$_{16}$H$_{33}$Si(OCH$_3$)$_3$, C$_{17}$H$_{35}$Si(OCH$_3$)$_3$, C$_{18}$H$_{37}$Si(OCH$_3$)$_3$, (CH$_3$)$_2$Si(OCH$_3$)$_2$, C$_2$H$_5$Si(CH$_3$)(OCH$_3$)$_2$, (C$_2$H$_5$)$_2$Si(OCH$_3$)$_2$, C$_3$H$_7$Si(CH$_3$)(OCH$_3$)$_2$, (C$_3$H$_7$)$_2$Si(OCH$_3$)$_2$, C$_4$H$_9$Si(CH$_3$)(OCH$_3$)$_2$, (C$_4$H$_9$)$_2$Si(OCH$_3$)$_2$, C$_5$H$_{11}$Si(CH$_3$)(OCH$_3$)$_2$, C$_6$H$_{13}$Si(CH$_3$)(OCH$_3$)$_2$, C$_7$H$_{15}$Si(CH$_3$)(OCH$_3$)$_2$, C$_8$H$_{17}$Si(CH$_3$)(OCH$_3$)$_2$, C$_9$H$_{19}$Si(CH$_3$)(OCH$_3$)$_2$, C$_{10}$H$_{21}$Si(CH$_3$)(OCH$_3$)$_2$, C$_{11}$H$_{23}$Si(CH$_3$)(OCH$_3$)$_2$, C$_{12}$H$_{25}$Si(CH$_3$)(OCH$_3$)$_2$, C$_{13}$H$_{27}$Si(CH$_3$)(OCH$_3$)$_2$, C$_{14}$H$_{29}$Si(CH$_3$)(OCH$_3$)$_2$, C$_{15}$H$_{31}$Si(CH$_3$)(OCH$_3$)$_2$, C$_{16}$H$_{33}$Si(CH$_3$)(OCH$_3$)$_2$, C$_{17}$H$_{35}$Si(CH$_3$)(OCH$_3$)$_2$, C$_{18}$H$_{37}$Si(CH$_3$)(OCH$_3$)$_2$, (CH$_3$)$_3$SiOCH$_3$, C$_2$H$_5$Si(CH$_3$)$_2$OCH$_3$, (C$_2$H$_5$)$_2$Si(CH$_3$)OCH$_3$, (C$_2$H$_5$)$_3$SiOCH$_3$, C$_3$H$_7$Si(CH$_3$)$_2$OCH$_3$, (C$_3$H$_7$)$_2$Si(CH$_3$)OCH$_3$, (C$_3$H$_7$)$_3$SiOCH$_3$, C$_4$H$_9$Si(CH$_3$)$_2$OCH$_3$, (C$_4$H$_9$)$_3$SiOCH$_3$, C$_5$H$_{11}$Si(CH$_3$)$_2$OCH$_3$, C$_6$H$_{13}$Si(CH$_3$)$_2$OCH$_3$, C$_7$H$_{15}$Si(CH$_3$)$_2$OCH$_3$, C$_8$H$_{17}$Si(CH$_3$)$_2$OCH$_3$, C$_9$H$_{19}$Si(CH$_3$)$_2$OCH$_3$, C$_{10}$H$_{21}$Si(CH$_3$)$_2$OCH$_3$, C$_{11}$H$_{23}$Si(CH$_3$)$_2$OCH$_3$, C$_{12}$H$_{25}$Si(CH$_3$)$_2$OCH$_3$, C$_{13}$H$_{27}$Si(CH$_3$)$_2$OCH$_3$, C$_{14}$H$_{29}$Si(CH$_3$)$_2$OCH$_3$, C$_{15}$H$_{31}$Si(CH$_3$)$_2$OCH$_3$, C$_{16}$H$_{33}$Si(CH$_3$)$_2$OCH$_3$, C$_{17}$H$_{35}$Si(CH$_3$)$_2$OCH$_3$, C$_{18}$H$_{37}$Si(CH$_3$)$_2$OCH$_3$, (CH$_3$)$_2$Si(H)OCH$_3$, CH$_3$Si(H)$_2$OCH$_3$, (C$_2$H$_5$)$_2$Si(F)OCH$_3$, C$_2$H$_5$Si(F)$_2$OCH$_3$, C$_2$H$_5$Si(CH$_3$)(H)OCH$_3$, (C$_3$H$_7$)$_2$Si(H)OCH$_3$ and the like; fluoroalkylmethoxysilanes such as CF$_3$CH$_2$CH$_2$Si(OCH$_3$)$_3$, C$_2$F$_5$CH$_2$CH$_2$Si(OCH$_3$)$_3$, C$_3$F$_7$CH$_2$CH$_2$Si(OCH$_3$)$_3$, C$_4$F$_9$CH$_2$CH$_2$Si(OCH$_3$)$_3$, C$_5$F$_{11}$CH$_2$CH$_2$Si(OCH$_3$)$_3$, C$_6$F$_{13}$CH$_2$CH$_2$Si(OCH$_3$)$_3$, C$_7$F$_{15}$CH$_2$CH$_2$Si(OCH$_3$)$_3$, C$_8$F$_{17}$CH$_2$CH$_2$Si(OCH$_3$)$_3$, CF$_3$CH$_2$CH$_2$Si(CH$_3$)(OCH$_3$)$_2$, C$_2$F$_5$CH$_2$CH$_2$Si(CH$_3$)(OCH$_3$)$_2$, C$_3$F$_7$CH$_2$CH$_2$Si(CH$_3$)(OCH$_3$)$_2$, C$_4$F$_9$CH$_2$CH$_2$Si(CH$_3$)(OCH$_3$)$_2$, C$_5$F$_{11}$CH$_2$CH$_2$Si(CH$_3$)(OCH$_3$)$_2$, C$_6$F$_{13}$CH$_2$CH$_2$Si(CH$_3$)(OCH$_3$)$_2$, C$_7$F$_{15}$CH$_2$CH$_2$Si(CH$_3$)(OCH$_3$)$_2$, C$_8$F$_{17}$CH$_2$CH$_2$Si(CH$_3$)(OCH$_3$)$_2$, CF$_3$CH$_2$CH$_2$Si(CH$_3$)$_2$OCH$_3$, C$_2$F$_5$CH$_2$CH$_2$Si(CH$_3$)$_2$OCH$_3$, C$_3$F$_7$CH$_2$CH$_2$Si(CH$_3$)$_2$OCH$_3$, C$_4$F$_9$CH$_2$CH$_2$Si(CH$_3$)$_2$OCH$_3$, C$_5$F$_{11}$CH$_2$CH$_2$Si(CH$_3$)$_2$OCH$_3$, C$_6$F$_{13}$CH$_2$CH$_2$Si(CH$_3$)$_2$OCH$_3$, C$_7$F$_{15}$CH$_2$CH$_2$Si(CH$_3$)$_2$OCH$_3$, C$_8$F$_{17}$CH$_2$CH$_2$Si(CH$_3$)$_2$OCH$_3$, CF$_3$CH$_2$CH$_2$Si(CH$_3$)(H)OCH$_3$ and the like; alkoxysilane compounds obtained by substituting a methyl group moiety of methoxy group of the above-mentioned alkylmethoxysilanes or fluoroalkylmethoxysilanes with a $C_2$-$C_{18}$ monovalent hydrocarbon group; and compounds obtained by substituting the methoxy group with —OC$(CH_3)$=CHCOCH$_3$, —OC$(CH_3)$=N—Si$(CH_3)_3$, —OC$(CF_3)$=N—Si$(CH_3)_3$, —O—CO—R$^{20}$ (where R$^{20}$ is a $C_1$-$C_{18}$ monovalent hydrocarbon group the hydrogen elements of which may partially or entirely be replaced with a fluorine element(s)), an alkyl sulfonate group the hydrogen elements of which may partially or entirely be replaced with a fluorine element(s), isocyanate group, amino group, dialkylamino group, isothiocyanate group, azide group, acetamide group, —N$(CH_3)$C(O)CH$_3$, —N$(CH_3)$C(O)CF$_3$, —N=C$(CH_3)$OSi$(CH_3)_3$, —N=C$(CF_3)$OSi$(CH_3)_3$, —NHC(O)—OSi$(CH_3)_3$, —NHC(O)—NH—Si$(CH_3)_3$, imidazole ring, oxazolidinone ring, morpholine ring, —NH—C(O)—Si$(CH_3)_3$, —N(H)$_{2-i}$(Si(H)$_j$R$^{19}_{3-j}$)$_i$ (where R$^{19}$ is a $C_1$-$C_{18}$ monovalent hydrocarbon group the hydrogen elements of which may partially or entirely be replaced with a fluorine element(s); i is an integer of 1 or 2; and j is an integer of from 0 to 2), chloro group, bromo group, iodo group, nitrile group or —CO—NH—Si$(CH_3)_3$.

Additionally, the number of $X^1$ of the silicon compound A, which is represented by 4-a-b in the general formula [1], is preferably 1 because the water-repellent film is uniformly formed thereby.

It is preferable that $R^1$ of the general formula [1] mutually independently represents at least one group selected from $C_1$-$C_{18}$ monovalent hydrocarbon groups the hydrogen elements of which may partially or entirely be replaced with a fluorine element(s) and more preferably at least one group selected from $C_mH_{2m+1}$ (m=1 to 18) and $C_nF_{2n+1}$CH$_2$CH$_2$ (n=1 to 8) because the wettability of the unevenly patterned surface can be more reduced when the water-repellent film is formed thereon, i.e., because a more excellent water repellency can be imparted to the surface. Additionally, it is preferable that m is from 1 to 12 and n is from 1 to 8 because the water-repellent film can be formed on the unevenly patterned surface in a short time.

Among these, the silicon compound A is particularly preferably hexamethyldisilazane, trimethylsilyl dimethylamine, trimethylsilyl diethylamine, tetramethyldisilazane, dimethylsilyl dimethylamine, dimethylsilyl diethylamine, 1,3-dibutyltetramethyldisilazane, butyldimethylsilyl dimethylamine, butyldimethylsilyl diethylamine, 1,3-dihexyltetramethyldisilazane, hexyldimethylsilyl dimethylamine, hexyldimethylsilyl diethylamine, 1,3-dioctyltetramethyldisilazane, octyldimethylsilyl dimethylamine, octyldimethylsilyl diethylamine, 1,3-didecyltetramethyldisilazane, decyldimethylsilyl dimethylamine, decyldimethylsilyl diethylamine, 1,3-didodecyltetramethyldisilazane, dodecyldimethylsilyl dimethylamine and dodecyldimethylsilyl diethylamine.

Furthermore, it is preferable that the acid is at least one selected from the group consisting of hydrogen chloride, sulfuric acid, perchloric acid, phosphoric acid, sulfonic acid represented by the general formula [2] and its anhydride, carboxylic acid represented by the general formula [3] and its anhydride, alkyl borate ester, aryl borate ester, boron tris(trifluoroacetate), trialkoxyboroxin, boron trifluoride and a silicon compound B represented by the general formula [4].

Sulfonic acid represented by the general formula [2] and its anhydride are exemplified by methansulfonic acid, benzenesulfonic acid, p-toluenesulfonic acid, trifluoromethanesulfonic acid, trifluoromethanesulfonic anhydride and the like. Carboxylic acid represented by the general formula [3] and its anhydride are exemplified by acetic acid, trifluoroacetic acid, pentafluoropropionic acid, acetic anhydride, trifluoroacetic anhydride, pentafluoropropionic anhydride and the like. The silicon compound B represented by the general formula [4] is preferably a chlorosilane, alkyl silyl alkyl sulfonate or alkyl silyl ester, and exemplified by trimethylsilyl trifluoroacetate, trimethylsilyl trifluoromethanesulfonate, dimethylsilyl trifluoroacetate, dimethylsilyl trifluoromethanesulfonate, butyldimethylsilyl trifluoroacetate, butyldimethylsilyl trifluoromethanesulfonate, hexyldimethylsilyl trifluoroacetate, hexyldimethylsilyl trifluoromethanesulfonate, octyldimethylsilyl trifluoroacetate, octyldimethylsilyl trifluoromethanesulfonate, decyldimethylsilyl trifluoroacetate, decyldimethylsilyl trifluoromethanesulfonate, do decyldimethylsilyl trifluoroacetate, dodecyldimethylsilyl trifluoromethanesulfonate and the like.

Furthermore, it is preferable that the base is at least one selected from the group consisting of ammonia, N,N,N',N'-tetramethylethylenediamine, triethylenediamine, dimethylaniline, alkylamine, dialkylamine, trialkylamine, pyridine, piperazine, N-alkylmorpholine and a silicon compound C represented by the general formula [5].

By virtue of the acid or the base which may be contained in the liquid chemical, the reaction between the silicon compound A and a silanol group serving as a reaction site of the silicon-based wafer is accelerated, so that it is possible to impart an excellent water repellency to the surface of the silicon-based wafer by conducting a surface treatment in the use of the liquid chemical. Incidentally, the acid or the base may constitute a part of the water-repellent film.

With consideration given to a reaction-accelerating effect, it is preferable that the liquid chemical contains acid. Particularly, the acid is preferably: a strong acid (Brönsted acid) such as hydrogen chloride, sulfuric acid, perchloric acid and the like; an alkane sulfonic acid the hydrogen elements of which are partially or entirely replaced with a fluorine element(s), or its anhydride, such as trifluoromethanesulfonic acid, trifluoromethanesulfonic anhydride and the like; carboxylic acid the hydrogen elements of which are partially or entirely replaced with a fluorine element(s), or its acid anhydride, such as trifluoroacetic acid, trifluoroacetic anhydride, pentafluoropropionic acid and the like; chlorosilane; alkyl silyl alkyl sulfonate the hydrogen elements of which are partially or entirely replaced with a fluorine element(s); or alkyl silyl ester the hydrogen elements of which are partially or entirely replaced with a fluorine element(s). Incidentally, alkyl silyl ester is formed such that an alkyl group and —O—CO—R' group (where R' is an alkyl group) are bonded to a silicon element. Moreover, the acid contained in the liquid chemical may be formed by a reaction; for example, it is acceptable to cause a reaction between an alkylchlorosilane and an alcohol to obtain a liquid chemical containing the formed alkylalkoxysilane as a silicon compound A, the formed hydrochloric acid as the acid, and an alcohol not consumed by the reaction as a solvent.

It is preferable that the acid is the silicon compound B represented by the general formula [4], and more preferably, at least one selected from the group consisting of trimethylsilyl trifluoroacetate, trimethylsilyl trifluoromethanesulfonate, dimethylsilyl trifluoroacetate, dimethylsilyl trifluoromethanesulfonate, butyldimethylsilyl trifluoroacetate, butyldimethylsilyl trifluoromethanesulfonate, hexyldimethylsilyl trifluoroacetate, hexyldimethylsilyl trifluoromethanesulfonate, octyldimethylsilyl trifluoroacetate, octyldimethylsilyl trifluoromethanesulfonate, decyldimethylsilyl trifluoroacetate, decyldimethylsilyl trifluoromethanesulfonate, do decyldimethylsilyl trifluoroacetate and dodecyldimethylsilyl trifluoromethanesulfonate.

The silicon compound B represented by the general formula [4] may be obtained by a reaction. For example, it may be obtained by reacting a silicon compound D represented by the following general formula [16] with at least one selected from the group consisting of trifluoroacetic acid, trifluoroacetic anhydride, trifluoromethanesulfonic acid and trifluoromethanesulfonic anhydride (hereinafter, they may be referred to as "acid D").

$(R^{21})_p(H)_q SiX^{10}{}_{4-p-q}$ [16]

(In the formula [16], $R^{21}$ mutually independently represents at least one group selected from the group consisting of $C_mH_{2m+1}$ (m=1 to 18) and $C_nF_{2n+1}CH_2CH_2$ (n=1 to 8). p is an integer of from 1 to 3. q is an integer of from 0 to 2. The total of p and q is 1 to 3. $X^{10}$ mutually independently represents a monovalent functional group of which element to be bonded to silicon element is nitrogen. It is possible to exemplify $(R^{21})_p(H)_q Si$— by $(CH_3)_3Si$—, $(CH_3)_2(H)Si$—, $(C_4H_9)(CH_3)_2Si$—, $(C_6H_{13})(CH_3)_2Si$—, $(C_8H_{17})(CH_3)_2Si$—, $(C_{10}H_{21})(CH_3)_2Si$—, $(C_{12}H_{25})(CH_3)_2Si$— and the like.)

For example, when mixing hexamethyldisilazane as the silicon compound D with trifluoroacetic anhydride as the acid D, the trifluoroacetic anhydride immediately reacts therewith to form trimethylsilyl trifluoroacetate as the silicon compound B.

Additionally, for example when mixing hexamethyldisilazane as the silicon compound D with trifluoromethanesulfonic anhydride as the acid D, the trifluoromethanesulfonic anhydride immediately reacts therewith to form trimethylsilyl trifluoromethanesulfonate as the silicon compound B.

Additionally, for example when mixing tetramethyldisilazane as the silicon compound D with trifluoroacetic anhydride as the acid D, the trifluoroacetic anhydride immediately reacts therewith to form dimethylsilyl trifluoroacetate as the silicon compound B.

Additionally, for example when mixing tetramethyldisilazane as the silicon compound D with trifluoromethanesulfonic anhydride as the acid D, the trifluoromethanesulfonic anhydride immediately reacts therewith to form dimethylsilyl trifluoromethanesulfonate as the silicon compound B.

Additionally, for example when mixing 1,3-dibutyltetramethyldisilazane as the silicon compound D with trifluoroacetic anhydride as the acid D, the trifluoroacetic anhydride immediately reacts therewith to form butyldimethylsilyl trifluoroacetate as the silicon compound B.

Additionally, for example when mixing 1,3-dibutyltetramethyldisilazane as the silicon compound D with trifluoromethanesulfonic anhydride as the acid D, the trifluoromethanesulfonic anhydride immediately reacts therewith to form butyldimethylsilyl trifluoromethanesulfonate as the silicon compound B.

Additionally, for example when mixing 1,3-dioctyltetramethyldisilazane as the silicon compound D with trifluoroacetic anhydride as the acid D, the trifluoroacetic anhydride immediately reacts therewith to form octyldimethylsilyl trifluoroacetate as the silicon compound B.

Additionally, for example when mixing 1,3-dioctyltetramethyldisilazane as the silicon compound D with trifluoromethanesulfonic anhydride as the acid D, the trifluoromethanesulfonic anhydride immediately reacts therewith to form octyldimethylsilyl trifluoromethanesulfonate as the silicon compound B.

Additionally, for example when mixing 1,3-didodecyltetramethyldisilazane as the silicon compound D with trifluoroacetic anhydride as the acid D, the trifluoroacetic anhydride immediately reacts therewith to form decyldimethylsilyl trifluoroacetate as the silicon compound B.

Additionally, for example when mixing 1,3-didecyltetramethyldisilazane as the silicon compound D with trifluoromethanesulfonic anhydride as the acid D, the trifluoromethanesulfonic anhydride immediately reacts therewith to form decyldimethylsilyl trifluoromethanesulfonate as the silicon compound B.

Additionally, for example when mixing octyldimethylsilyl dimethylamine as the silicon compound D with trifluoroacetic anhydride as the acid D, the trifluoroacetic anhydride immediately reacts therewith to form octyldimethylsilyl trifluoroacetate as the silicon compound B.

Additionally, for example when mixing decyldimethylsilyl dimethylamine as the silicon compound D with trifluoroacetic anhydride as the acid D, the trifluoroacetic anhydride immediately reacts therewith to form decyldimethylsilyl trifluoroacetate as the silicon compound B.

In this connection, in view of a good stability, the more preferable is a water-repellent liquid chemical for silicon-based wafers prepared by using (as the acid D) at least one selected from trifluoroacetic anhydride and trifluoromethanesulfonic anhydride and by reacting it with the silicon compound D to form the silicon compound B, or a water-repellent liquid chemical for silicon-based wafers prepared by using the silicon compound A and the silicon compound B as starting materials.

The water-repellent liquid chemical for silicon-based wafers, according to the present invention may be one in which the silicon compound D is excessively added relative to the acid D and in which an excess of the silicon compound D that is not consumed by the reaction serves as the silicon compound A to contribute to the formation of the water-repellent film. Incidentally, the number of moles of the silicon compound D is preferably 0.2 to 100000 times, more preferably 0.5 to 50000 times, much more preferably 1 to 10000 times the number of moles of the acid D.

As an aside, when the silicon compound B represented by the general formula [4] can be obtained, it is optional to adopt any reactions other than the reaction between the silicon compound D and the acid D.

The monovalent functional group of which element to be bonded to silicon element is nitrogen, represented by $X^{10}$ in the general formula [16], may include not only a hydrogen element, carbon element, nitrogen element and oxygen element but also a silicon element, sulfur element, halogen element and the like. Examples of the monovalent functional group of which element to be bonded to silicon element is nitrogen are an isocyanate group, amino group, dialkylamino group, isothiocyanate group, azide group, acetamide group, —N(CH$_3$)C(O)CH$_3$, —N(CH$_3$)C(O)CF$_3$, —N=C(CH$_3$)OSi(CH$_3$)$_3$, —N=C(CF$_3$)OSi(CH$_3$)$_3$, —NHC(O)—OSi(CH$_3$)$_3$, —NHC(O)—NH—Si(CH$_3$)$_3$, imidazole ring, oxazolidinone ring, morpholine ring, —NH—C(O)—Si(CH$_3$)$_3$, —N(H)$_{2-i}$(Si(H)$_j$R$^{19}$$_{3-j}$)$_i$ (where $R^{19}$ is a $C_1$-$C_{18}$ monovalent hydrocarbon group the hydrogen elements of which may partially or entirely be replaced with a fluorine element(s); i is an integer of 1 or 2; and j is an integer of from 0 to 2) and the like.

The silicon compound D of the general formula [16] is exemplified by: aminosilanes such as (CH$_3$)$_3$SiNH$_2$, C$_4$H$_9$Si(CH$_3$)$_2$NH$_2$, C$_6$H$_{13}$Si(CH$_3$)$_2$NH$_2$, C$_8$H$_{17}$Si(CH$_3$)$_2$NH$_2$, C$_{10}$H$_{21}$Si(CH$_3$)$_2$NH$_2$, C$_{12}$H$_{25}$Si(CH$_3$)$_2$NH$_2$ and (CH$_3$)$_2$Si(H)NH$_2$; those obtained by substituting an amino group (—NH$_2$ group) of the above-mentioned aminosilanes with —N=C=O, —N(CH$_3$)$_2$, —N(C$_2$H$_5$)$_2$, —N=C=S, —N$_3$, —NHC(O)CH$_3$, —N(CH$_3$)C(O)CH$_3$, —N(CH$_3$)C(O)CF$_3$, —N=C(CH$_3$)OSi(CH$_3$)$_3$, —N=C(CF$_3$)OSi(CH$_3$)$_3$, —NHC(O)—OSi(CH$_3$)$_3$, —NHC(O)—NH—Si(CH$_3$)$_3$, imidazole ring, oxazolidinone ring, morpholine ring, —NH—C(O)—Si(CH$_3$)$_3$, —NH—Si(CH$_3$)$_3$, —NH—Si(H)(CH$_3$)$_2$, —NH—Si(CH$_3$)$_2$(C$_4$H$_9$), —NH—Si(CH$_3$)$_2$(C$_6$H$_{13}$), —NH—Si(CH$_3$)$_2$(C$_8$H$_{17}$), —NH—Si(CH$_3$)$_2$(C$_{10}$H$_{21}$), —NH—Si(CH$_3$)$_2$(C$_{12}$H$_{25}$), —NH—Si(CH$_3$)$_2$(C$_2$H$_4$C$_6$F$_{13}$) or —N—{Si(CH$_3$)$_3$}$_2$; and the like.

Among these, the silicon compound D represented by the general formula [16] is preferably the silicon compound A.

In the water-repellent liquid chemical for silicon-based wafers, the concentration of the silicon compound B is preferably 0.01 to 20 mass % relative to the total quantity of 100 mass % of the silicon compound A. Low concentrations are not preferable since the effect of the silicon compound B is little. Excessively high concentrations are also not preferable because the effect of the silicon compound B is not improved and because there is a concern that the surface of the silicon-based wafer is subjected to erosion. It is therefore particularly preferable that the concentration of the silicon compound B is 0.05 to 15 mass % relative to the total quantity of 100 mass % of the silicon compound A.

Furthermore, in the water-repellent liquid chemical for silicon-based wafers, the silicon compound A and the silicon compound B may be diluted with an organic solvent. The total addition quantity of the silicon compound A and the silicon compound B is preferably from 0.1 to 100 mass % relative to the total quantity of 100 mass % of the water-repellent liquid chemical for silicon-based wafers, because the water-repellent film can be readily and uniformly formed at least on the surfaces of the recessed portions of the uneven pattern. When it is less than 0.1 mass %, the effect of protecting the uneven pattern tends to become insufficient. It is more preferably from 0.5 to 50 mass %, much more preferably from 1 to 30 mass %. In the case where the water-repellent liquid chemical for silicon-based wafers is one diluted with an organic solvent, the liquid chemical may contain an organic solvent having a low boiling point. However, it is important that a component the amount of which is the largest in mass ratio among components of the water-repellent liquid chemical for silicon-based wafers has a boiling point exceeding 40° C. The boiling point is more preferably in excess of 60° C., much more preferably in excess of 80° C.

As the organic solvent which may be used for dilution of the water-repellent liquid chemical for silicon-based wafers, suitably adoptable examples are organic solvents such as hydrocarbons, esters, ethers, ketones, halogen element-containing solvents, sulfoxide-based solvents, lactone-based solvents, carbonate-based solvents, polyalcohol derivatives having no OH group, nitrogen element-containing solvents having no N—H group and the like, and a mixture liquid of these. Among these, it is preferable to use hydrocarbons, esters, ethers, halogen element-containing solvents, polyalcohol derivatives having no OH group or a mixture of these, since the water-repellent film can be formed on the unevenly patterned surface with a short time.

Examples of hydrocarbons are toluene, benzene, xylene, hexane, heptane, octane and the like. Examples of esters are ethyl acetate, propyl acetate, butyl acetate, ethyl acetoacetate and the like. Examples of ethers are diethyl ether, dipropyl ether, dibutyl ether, tetrahydrofuran, dioxane and the like. Examples of ketones are acetone, acetylacetone, methyl ethyl ketone, methyl propyl ketone, methyl butyl ketone, cyclohexanone, isophorone and the like. Examples of the halogen element-containing solvents are: perfluorocarbons such as perfluorooctane, perfluorononane, perfluorocyclopentane, perfluorocyclohexane, hexafluorobenzene and the like; hydrofluorocarbons such as 1,1,1,3,3-pentafluorobutane, octafluorocyclopentane, 2,3-dihydrodecafluoropentane, ZEORORA-H (produced by ZEON CORPORATION) and the like; hydrofluoroethers such as methyl perfluoroisobutyl ether, methyl perfluorobutyl ether, ethyl perfluorobutyl ether, ethyl perfluoroisobutyl ether, ASAHIKLIN AE-3000 (produced by Asahi Glass Co., Ltd.), Novec 7100, Novec 7200, Novec 7300, Novec 7600 (any of these are produced by 3M Limited) and the like; chlorocarbons such as tetrachloromethane and the like; hydrochlorocarbons such as chloroform and the like; chlorofluorocarbons such as dichlorodifluoromethane and the like; hydrochlorofluorocarbons such as 1,1-dichloro-2,2,3,3,3-pentafluoropropane, 1,3-dichloro-1,1,2,2,3-pentafluoropropane, 1-chloro-3,3,3-trifluoropropene, 1,2-dichloro-3,3,3-trifluoropropene and the like; perfluoroethers; perfluoropolyethers; and the like. Examples of the sulfoxide-based solvents are dimethyl sulfoxide and the like. Examples of the lactone-based solvents are γ-butyrolactone, γ-valerolactone, γ-hexanolactone, γ-heptanolactone, γ-octanolactone, γ-nonanolactone, γ-decanolactone, γ-undecanolactone, γ-dodecanolactone, δ-valerolactone, δ-hexanolactone, δ-octanolactone, δ-nonanolactone, δ-decanolactone, δ-undecanolactone, δ-dodecanolactone, ∈-hexanolactone and the like. Examples of the carbonate-based solvents are dimethyl carbonate, ethyl methyl carbonate, diethyl carbonate, propylene carbonate and the like. Examples of the polyalcohol derivatives having no OH group are ethylene glycol dimethyl ether, ethylene glycol diethyl ether, ethylene glycol dibutyl ether, ethylene glycol monomethyl ether acetate, ethylene glycol monoethyl ether acetate, ethylene glycol monobutyl ether acetate, ethylene glycol diacetate, diethylene glycol dimethyl ether, diethylene glycol ethyl methyl ether, diethylene glycol diethyl ether, diethylene glycol butyl methyl ether, diethylene glycol dibutyl ether, diethylene glycol monomethyl ether acetate, diethylene glycol monoethyl ether acetate, diethylene glycol monobutyl ether acetate, diethylene glycol diacetate, triethylene glycol dimethyl ether, triethylene glycol diethyl ether, triethylene glycol dibutyl ether, triethylene glycol butyl methyl ether, triethylene glycol monomethyl ether acetate, triethylene glycol monoethyl ether acetate, triethylene glycol monobutyl ether acetate, triethylene glycol diacetate, tetraethylene glycol dimethyl ether, tetraethylene glycol diethyl ether, tetraethylene glycol dibutyl ether, tetraethylene glycol monomethyl ether acetate, tetraethylene glycol monoethyl ether acetate, tetraethylene glycol monobutyl ether acetate, tetraethylene glycol diacetate, propylene glycol dimethyl ether, propylene glycol diethyl ether, propylene glycol dibutyl ether, propylene glycol monomethyl ether acetate, propylene glycol monoethyl ether acetate, propylene glycol monobutyl ether acetate, propylene glycol diacetate, dipropylene glycol dimethyl ether, dipropylene glycol methyl propyl ether, dipropylene glycol diethyl ether, dipropylene glycol dibutyl ether, dipropylene glycol monomethyl ether acetate, dipropylene glycol monoethyl ether acetate, dipropylene glycol monobutyl ether acetate, dipropylene glycol diacetate, tripropylene glycol dimethyl ether, tripropylene glycol diethyl ether, tripropylene glycol dibutyl ether, tripropylene glycol monomethyl ether acetate, tripropylene glycol monoethyl ether acetate, tripropylene glycol monobutyl ether acetate, tripropylene glycol diacetate, tetrapropylene glycol dimethyl ether, tetrapropylene glycol monomethyl ether acetate, tetrapropylene glycol diacetate, butylene glycol dimethyl ether, butylene glycol monomethyl ether acetate, butylene glycol diacetate, glycerine triacetate and the like. Examples of the nitrogen element-containing solvents having no N—H group are N,N-dimethylformamide, N,N-dimethylacetamide, N-methyl-2-pyrrolidone, triethylamine, pyridine and the like.

Additionally, it is preferable to use a nonflammable one as a part or the entire of the solvent since the water-repellent liquid chemical for silicon-based wafers becomes nonflammable or increases in flash point thereby reducing the risk of the water-repellent liquid chemical for silicon-based wafers. Most of the halogen element-containing solvents are nonflammable, so that such a halogen element-containing nonflammable solvent can be preferably used as a nonflammable organic solvent.

Additionally, in view of safety under the fire protection law, it is preferable to use a solvent having a flash point exceeding 70° C. as the above-mentioned solvent.

Moreover, according to "Globally Harmonized System of Classification and Labelling of Chemicals; GHS", a solvent having a flash point of not higher than 93° C. is defined as "a flammable liquid". Therefore, when a solvent having a flash point exceeding 93° C. is used as the solvent, the water-repellent liquid chemical tends to have a flash point exceeding 93° C. even if the solvent is not nonflammable one. Hence the liquid chemical hardly applies to "a flammable liquid", which is preferable in view of safety.

Additionally, most of the lactone-based solvents, carbonate-based solvents, the polyalcohol derivatives having no OH group have a high flash point; therefore, it is preferable to use these solvents because the risk of the water-repellent liquid chemical for silicon-based wafers can be reduced. In view of the safety, it is more preferable to use a solvent having a flash point exceeding 70° C. and concretely exemplified by γ-butyrolactone, γ-valerolactone, γ-hexanolactone, γ-heptanolactone, γ-octanolactone, γ-nonanolactone, γ-decanolactone, γ-undecanolactone, γ-dodecanolactone, δ-valerolactone, δ-hexanolactone, δ-octanolactone, δ-nonanolactone, δ-decanolactone, δ-undecanolactone, δ-dodecanolactone, ∈-hexanolactone, propylene carbonate, ethylene glycol dibutyl ether, ethylene glycol monobutyl ether acetate, ethylene glycol diacetate, diethylene glycol ethyl methyl ether, diethylene glycol diethyl ether, diethylene glycol butyl methyl ether, diethylene glycol dibutyl ether, diethylene glycol monomethyl ether acetate, diethylene glycol monoethyl ether acetate, diethylene glycol monobutyl ether acetate, diethylene glycol diacetate, triethylene glycol dimethyl ether, triethylene glycol diethyl ether, triethylene glycol dibutyl ether, triethylene glycol butyl methyl ether, triethylene glycol monomethyl ether acetate, triethylene glycol monoethyl ether acetate, triethylene glycol monobutyl ether acetate, triethylene glycol diacetate, tetraethylene glycol dimethyl ether, tetraethylene glycol diethyl ether, tetraethylene glycol dibutyl ether, tetraethylene glycol monomethyl ether acetate, tetraethylene glycol monoethyl ether acetate, tetraethylene glycol monobutyl ether acetate, tetraethylene glycol diacetate, propylene glycol diacetate, dipropylene glycol methyl propyl ether, dipropylene glycol monomethyl ether acetate, dipropylene glycol monoethyl ether acetate, dipropylene glycol monobutyl ether acetate, dipropylene glycol diacetate, tripropylene glycol dimethyl ether, tripropylene glycol diethyl ether, tripropylene glycol dibutyl ether, tripropylene glycol monomethyl ether acetate, tripropylene glycol monoethyl ether acetate, tripropylene glycol monobutyl ether acetate, tripropylene glycol diacetate, tetrapropylene glycol dimethyl ether, tetrapropylene glycol monomethyl ether acetate, tetrapropylene glycol diacetate, butylene glycol diacetate, glycerine triacetate and the like. It is much more preferable to use a solvent having a flash point exceeding 93° C., such as γ-butyrolactone, γ-hexanolactone, γ-heptanolactone, γ-octanolactone, γ-nonanolactone, γ-decanolactone, γ-undecanolactone, γ-dodecanolactone, δ-valerolactone, δ-hexanolactone, δ-octanolactone, δ-nonanolactone, δ-decanolactone, δ-undecanolactone, δ-dodecanolactone, δ-hexanolactone, propylene carbonate, ethylene glycol diacetate, diethylene glycol butyl methyl ether, diethylene glycol dibutyl ether, diethylene glycol diacetate, diethylene glycol monomethyl ether acetate, diethylene glycol monoethyl ether acetate, diethylene glycol monobutyl ether acetate, triethylene glycol dimethyl ether, triethylene glycol diethyl ether, triethylene glycol dibutyl ether, triethylene glycol butyl methyl ether, triethylene glycol monomethyl ether acetate, triethylene glycol monoethyl ether acetate, triethylene glycol monobutyl ether acetate, triethylene glycol diacetate, tetraethylene glycol dimethyl ether, tetraethylene glycol diethyl ether, tetraethylene glycol dibutyl ether, tetraethylene glycol monomethyl ether acetate, tetraethylene glycol monoethyl ether acetate, tetraethylene glycol monobutyl ether acetate, tetraethylene glycol diacetate, propylene glycol diacetate, dipropylene glycol diacetate, dipropylene glycol monomethyl ether acetate, dipropylene glycol monoethyl ether acetate, dipropylene glycol monobutyl ether acetate, tripropylene glycol dimethyl ether, tripropylene glycol diethyl ether, tripropylene glycol dibutyl ether, tripropylene glycol monomethyl ether acetate, tripropylene glycol monoethyl ether acetate, tripropylene glycol monobutyl ether acetate, tripropylene glycol diacetate, tetrapropylene glycol dimethyl ether, tetrapropylene glycol monomethyl ether acetate, tetrapropylene glycol diacetate, butylene glycol diacetate, glycerine triacetate and the like.

Additionally, in the water-repellent liquid chemical for silicon-based wafers, the starting material preferably has a total water content of not higher than 5000 mass ppm relative to the total quantity of the starting material. In a case where the total water content exceeds 5000 mass ppm, the effect of the silicon compound A is so reduced as to make it difficult to form the water-repellent film in a short time. Accordingly, the smaller the water content in the starting material of the water-repellent liquid chemical for silicon-based wafers, the more preferable it is. Particularly, it is preferably not higher than 1000 mass ppm, much more preferably not higher than 500 mass ppm. Incidentally, the water content in the starting material of the water-repellent liquid chemical for silicon-based wafers may be not lower than 5 mass ppm within the above-mentioned range.

Hereinafter, a second process will be discussed. The water-repellent liquid chemical for metal-based wafers is one containing: at least one kind of compound selected from compounds represented by the general formulas [6] to [12] and salt compounds thereof; and solvent.

A hydrocarbon group represented by $R^8$ of the general formula [6] is exemplified by an alkyl group, alkylene group, and those the hydrogen elements of which are partially or entirely replaced with a fluorine element(s).

Furthermore, a hydrocarbon group represented by $R^9$ of the general formula [6] is exemplified by an alkyl group, alkylene group, and those the hydrogen elements of which are partially or entirely replaced with a fluorine element(s). It is preferably —$OR^{22}$ (where $R^{22}$ is a $C_1$-$C_{18}$ hydrocarbon group). Moreover, it is preferable that $R^{22}$ has a carbon number of from 1 to 8, more preferably from 1 to 4, since a more excellent water repellency is obtained thereby. It is further preferable that $R^{22}$ is a straight-chained alkyl group.

A phosphorous element-containing compound represented by the general formula [6] is exemplified by $CH_3P(O)(OH)_2$, $C_2H_5P(O)(OH)_2$, $C_3H_7P(O)(OH)_2$, $C_4H_9P(O)(OH)_2$, $C_5H_{11}P(O)(OH)_2$, $C_6H_{13}P(O)(OH)_2$, $C_7H_{15}P(O)(OH)_2$, $C_8H_{17}P(O)(OH)_2$, $C_9H_{19}P(O)(OH)_2$, $C_{10}H_{21}P(O)(OH)_2$, $C_{11}H_{23}P(O)(OH)_2$, $C_{12}H_{25}P(O)(OH)_2$, $C_{13}H_{27}P(O)(OH)_2$, $C_{14}H_{29}P(O)(OH)_2$, $C_{15}H_{31}P(O)(OH)_2$, $C_{16}H_{33}P(O)(OH)_2$, $C_{17}H_{35}P(O)(OH)_2$, $C_{18}H_{37}P(O)(OH)_2$, $C_6H_5P(O)(OH)_2$, $CF_3P(O)(OH)_2$, $C_2F_5P(O)(OH)_2$, $C_3F_7P(O)(OH)_2$, $C_4F_9P(O)(OH)_2$, $C_5F_{11}P(O)(OH)_2$, $C_6F_{13}P(O)(OH)_2$, $C_7F_{15}P(O)(OH)_2$, $C_8F_{17}P(O)(OH)_2$, $CF_3C_2H_4P(O)(OH)_2$, $C_2F_5C_2H_4P(O)(OH)_2$, $C_3F_7C_2H_4P(O)(OH)_2$, $C_4F_9C_2H_4P(O)(OH)_2$, $C_5F_{11}C_2H_4P(O)(OH)_2$, $C_6F_{13}C_2H_4P(O)(OH)_2$, $C_7F_{15}C_2H_4P(O)(OH)_2$, $C_8F_{17}C_2H_4P(O)(OH)_2$, those obtained by substituting —$P(O)(OH)_2$ group of these compounds with —$P(O)(OH)OCH_3$ group, —$P(O)(OH)OC_2H_5$ group, —$P(O)(OCH_3)_2$ group or —$P(O)(OC_2H_5)_2$ group, and the like.

In order to exhibit more excellent water repellency, a phosphorous element-containing compound represented by the general formula [6] is preferably a compound in which g of the general formula [6] is 1 or 2, and more preferably a compound in which g is 2, the compound being represented by the following general formula [17].

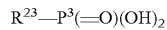

$$R^{23}-P^3(=O)(OH)_2 \qquad [17]$$

(In the formula [17], $R^{23}$ represents a $C_1$-$C_{18}$ monovalent hydrocarbon group the hydrogen elements of which may partially or entirely be replaced with a fluorine element(s).)

It is possible to exemplify $R^8$ of the general formula [6] and $R^{23}$ of the general formula [17] by an alkyl group, phenyl group, phenyl group the hydrogen elements of which are replaced with alkyl groups, naphthyl group, these hydrocarbon groups the hydrogen elements of which are partially or entirely replaced with a fluorine element(s), and the like.

Additionally, $R^8$ of the general formula [6] and $R^{23}$ of the general formula [17] having a carbon number of from 2 to 16, particularly from 4 to 14 and more particularly from 6 to 14 are preferable because more excellent water repellency is obtained thereby. In addition, it is preferable that the hydrocarbon group the hydrogen elements of which may partially or entirely be replaced with a fluorine element(s) is an alkyl group, more preferably a straight-chained alkyl group. If a straight-chained alkyl group is used as the hydrocarbon group, $R^8$ and $R^{23}$ serving as hydrophobic moieties of phosphorous element-containing compounds represented by the general formulas [6] and [17] tend to be arranged perpendicularly to the surface of the water-repellent film at the time of forming the water-repellent film thereby more excellently exhibiting a water-repellency-imparting effect, which is further preferable. Moreover, $R^8$ and $R^{23}$ are preferably hydrocarbon groups whose hydrogen elements are partially or entirely be substituted with a fluorine element(s), in order to impart a far better water repellency.

Additionally, the phosphorous element-containing compound may exist in the form of a salt represented by the general formulas [6] and [17]. The salt can be cited by ammonium salt, amine salt and the like.

Additionally, it is preferable that $R^{10}$ of the general formula [7], $R^{11}$ of the general formula [8], $R^{14}$ of the general formula [9], $R^{15}$ of the general formula [10], $R^{16}$ of the general formula [11] and $R^{17}$ and $R^{18}$ of the general formula [12] are $C_1$-$C_{18}$ monovalent hydrocarbon groups each of which hydrogen elements may partially or entirely be replaced with a fluorine element(s), and more preferably, $C_mH_{2m+1}$ (m=1 to 18), $C_nF_{2n+1}CH_2CH_2$ (n=1 to 8), $C_rF_{2r+1}CH_2$ (r=1 to 8) and $C_sF_{2s+1}$ (s=1 to 8).

A compound represented by the general formula [7] is exemplified by $CH_3COCl$, $C_2H_5COCl$, $C_3H_7COCl$, $C_4H_9COCl$, $C_5H_{11}COCl$, $C_6H_{13}COCl$, $C_7H_{15}COCl$, $C_8H_{17}COCl$, $C_9H_{19}COCl$, $C_{10}H_{21}COCl$, $C_{11}H_{23}COCl$, $C_{12}H_{25}COCl$, $C_{13}H_{27}COCl$, $C_{14}H_{29}COCl$, $C_{15}H_{31}COCl$, $C_{16}H_{33}COCl$, $C_{17}H_{35}COCl$, $C_{18}H_{37}COCl$, $C_6H_5COCl$, $CF_3COCl$, $C_2F_5COCl$, $C_3F_7COCl$, $C_4F_9COCl$, $C_5F_{11}COCl$, $C_6F_{13}COCl$, $C_7F_{15}COCl$, $C_8F_{17}COCl$, compounds obtained by substituting —Cl group of the above compounds with —F group, —Br group or —I group, and the like.

In view of the compatibility with a substance containing a metal element and the water-repellency-imparting effect on the surface of the metal-based wafer, the particularly preferable examples of the above compounds are $C_8H_{17}COCl$, $C_9H_{19}COCl$, $C_{10}H_{21}COCl$, $C_{11}H_{23}COCl$, $C_{12}H_{25}COCl$, $C_{13}H_{27}COCl$, $C_{14}H_{29}COCl$, $C_{15}H_{31}COCl$, $C_{16}H_{33}COCl$, $C_{17}H_{35}COCl$, $C_{18}H_{37}COCl$, $C_4F_9COCl$, $C_5F_{11}COCl$, $C_6F_{13}COCl$, $C_7F_{15}COCl$, $C_8F_{17}COCl$ and the like.

A compound represented by the general formula [8] is exemplified by compounds such as $C_5H_{11}NH_2$, $C_6H_{13}NH_2$, $C_7H_{15}NH_2$, $C_8H_{17}NH_2$, $C_9H_{19}NH_2$, $C_{10}H_{21}NH_2$, $C_{11}H_{23}NH_2$, $C_{12}H_{25}NH_2$, $C_{13}H_{27}NH_2$, $C_{14}H_{29}NH_2$, $C_{15}H_{31}NH_2$, $C_{16}H_{33}NH_2$, $C_{17}H_{35}NH_2$, $C_{18}H_{37}NH_2$, $CF_3NH_2$, $CF_3C_2H_4NH_2$, $C_2F_5NH_2$, $C_2F_5C_2H_4NH_2$, $C_3F_7NH_2$, $C_3F_7C_2H_4NH_2$, $C_4F_9NH_2$, $C_4F_9C_2H_4NH_2$, $C_4F_9CH_2NH_2$, $C_5F_{11}NH_2$, $C_5F_{11}C_2H_4NH_2$, $C_5F_{11}CH_2NH_2$, $C_6F_{13}NH_2$, $C_6F_{13}C_2H_4NH_2$, $C_6F_{13}CH_2NH_2$, $C_7F_{15}NH_2$, $C_7F_{15}C_2H_4NH_2$, $C_7F_{15}CH_2NH_2$, $C_8F_{17}NH_2$, $C_8F_{17}C_2H_4NH_2$, $C_6F_{11}H_2NH_2$, $C_8F_{15}H_2NH_2$, $(C_3H_7)_2NH$, $(C_4H_9)_2NH$, $(C_5H_{11})_2NH$, $(C_6H_{13})_2NH$, $(C_7H_{15})_2NH$, $(C_8H_{17})_2NH$, $(C_9H_{19})_2NH$, $(C_{10}H_{21})_2NH$, $(C_{11}H_{23})_2NH$, $(C_{12}H_{25})_2NH$, $(C_{13}H_{27})_2NH$, $(C_{14}H_{29})_2NH$, $(C_{15}H_{31})_2NH$, $(C_{16}H_{33})_2NH$, $(C_{17}H_{35})_2NH$, $(C_{18}H_{37})_2NH$, $(CF_3)_2NH$, $(C_2F_5)_2NH$, $(C_3F_7)_2NH$, $(C_4F_9)_2NH$, $(C_5F_{11})_2NH$, $(C_6F_{13})_2NH$, $(C_7F_{15})_2NH$, $(C_8F_{17})_2NH$, $(C_4F_7H_2)_2NH$, $(C_6F_{11}H_2)_2NH$, $(C_8F_{15}H_2)_2NH$, $(C_2H_5)_3N$, $(C_3H_7)_3N$, $(C_4H_9)_3N$, $(C_5H_{11})_3N$, $(C_6H_{13})_3N$, $(C_7H_{15})_3N$, $(C_8H_{17})_3N$, $(C_9H_{19})_3N$, $(C_{10}H_{21})_3N$, $(C_{11}H_{23})_3N$, $(C_{12}H_{25})_3N$, $(C_{13}H_{27})_3N$, $(C_{14}H_{29})_3N$, $(C_{15}H_{31})_3N$, $(C_{16}H_{33})_3N$, $(C_{17}H_{35})_3N$, $(C_{18}H_{37})_3N$, $(CF_3)_3N$, $(C_2F_5)_3N$, $(C_3F_7)_3N$, $(C_4F_9)_3N$, $(C_5F_{11})_3N$, $(C_6F_{13})_3N$, $(C_7F_{15})_3N$, $(C_8F_{17})_3N$, $(C_4F_7H_2)_3N$, $(C_6F_{11}H_2)_3N$, $(C_8F_{15}H_2)_3N$, $(C_5H_{11})(CH_3)NH$, $(C_6H_{13})(CH_3)NH$, $(C_7H_{15})(CH_3)NH$, $(C_8H_{17})(CH_3)NH$, $(C_9H_{19})(CH_3)NH$, $(C_{10}H_{21})(CH_3)NH$, $(C_{11}H_{23})(CH_3)NH$, $(C_{12}H_{25})(CH_3)NH$, $(C_{13}H_{27})(CH_3)NH$, $(C_{14}H_{29})(CH_3)NH$, $(C_{15}H_{31})(CH_3)NH$, $(C_{16}H_{33})(CH_3)NH$, $(C_{17}H_{35})(CH_3)NH$, $(C_{18}H_{37})(CH_3)NH$, $(CF_3)(CH_3)NH$, $(C_2F_5)(CH_3)NH$, $(C_3F_7)(CH_3)NH$, $(C_4F_9)(CH_3)NH$, $(C_5F_{11})(CH_3)NH$, $(C_6F_{13})(CH_3)NH$, $(C_7F_{15})(CH_3)NH$, $(C_8F_{17})(CH_3)NH$, $(C_3H_7)(CH_3)_2N$, $(C_4H_9)(CH_3)_2N$, $(C_5H_{11})(CH_3)_2N$, $(C_6H_{13})(CH_3)_2N$, $(C_7H_{15})(CH_3)_2N$, $(C_8H_{17})(CH_3)_2N$, $(C_9H_{19})(CH_3)_2N$, $(C_{10}H_{21})(CH_3)_2N$, $(C_{11}H_{23})(CH_3)_2N$, $(C_{12}H_{25})(CH_3)_2N$, $(C_{13}H_{27})(CH_3)_2N$, $(C_{14}H_{29})(CH_3)_2N$, $(C_{15}H_{31})(CH_3)_2N$, $(C_{16}H_{33})(CH_3)_2N$, $(C_{17}H_{35})(CH_3)_2N$, $(C_{18}H_{37})(CH_3)_2N$, $(CF_3)(CH_3)_2N$, $(C_2F_5)(CH_3)_2N$, $(C_3F_7)(CH_3)_2N$, $(C_4F_9)(CH_3)_2N$, $(C_5F_{11})(CH_3)_2N$, $(C_6F_{13})(CH_3)_2N$, $(C_7F_{15})(CH_3)_2N$ and $(C_8F_{17})(CH_3)_2N$ and the like. In addition, a compound represented by the general formula [8] may be used in the form of a salt. It is possible to exemplify the salt by inorganic acid salts such as carbonate, hydrochloride, sulfate, nitrate and the like, and organic acid salts such as acetate, propionate, butyrate, phthalate and the like.

In consideration of the compatibility with a substance containing a metal element and the water-repellency-imparting effect on the surface of the metal-based wafer, the particularly preferable examples of the above compounds are compounds such as $C_6H_{13}NH_2$, $C_7H_{15}NH_2$, $C_8H_{17}NH_2$, $C_9H_{19}NH_2$, $C_{10}H_{21}NH_2$, $C_{11}H_{23}NH_2$, $C_{12}H_{25}NH_2$, $C_{13}H_{27}NH_2$, $C_{14}H_{29}NH_2$, $C_{15}H_{31}NH_2$, $C_{16}H_{33}NH_2$, $C_{17}H_{35}NH_2$, $C_{18}H_{37}NH_2$, $(C_4H_9)_2NH$, $(C_5H_{11})_2NH$, $(C_6H_{13})_2NH$, $(C_7H_{15})_2NH$, $(C_8H_{17})_2NH$, $(C_9H_{19})_2NH$, $(C_{10}H_{21})_2NH$, $(C_{11}H_{23})_2NH$, $(C_{12}H_{25})_2NH$, $(C_{13}H_{27})_2NH$, $(C_{14}H_{29})_2NH$, $(C_{15}H_{31})_2NH$, $(C_{16}H_{33})_2NH$, $(C_{17}H_{35})_2NH$, $(C_{18}H_{37})_2NH$, $(C_4H_9)_3N$, $(C_5H_{11})_3N$, $(C_6H_{13})_3N$, $(C_7H_{15})_3N$, $(C_8H_{17})_3N$, $(C_9H_{19})_3N$, $(C_{10}H_{21})_3N$, $(C_{11}H_{23})_3N$, $(C_{12}H_{25})_3N$, $(C_{13}H_{27})_3N$, $(C_{14}H_{29})_3N$, $(C_{15}H_{31})_3N$, $(C_{16}H_{33})_3N$, $(C_{17}H_{35})_3N$, $(C_{18}H_{37})_3N$, $(C_5H_{11})(CH_3)NH$, $(C_6H_{13})(CH_3)NH$, $(C_7H_{15})(CH_3)NH$, $(C_8H_{17})(CH_3)NH$, $(C_9H_{19})(CH_3)NH$, $(C_{10}H_{21})(CH_3)NH$, $(C_{11}H_{23})(CH_3)NH$, $(C_{12}H_{25})(CH_3)NH$, $(C_{13}H_{27})(CH_3)NH$, $(C_{14}H_{29})(CH_3)NH$, $(C_{15}H_{31})(CH_3)NH$, $(C_{16}H_{33})(CH_3)NH$, $(C_{17}H_{35})(CH_3)NH$, $(C_{18}H_{37})(CH_3)NH$, $(C_4H_9)(CH_3)_2N$, $(C_5H_{11})(CH_3)_2N$, $(C_6H_{13})(CH_3)_2N$, $(C_7H_{15})(CH_3)_2N$, $(C_8H_{17})(CH_3)_2N$, $(C_9H_{19})(CH_3)_2N$, $(C_{10}H_{21})(CH_3)_2N$, $(C_{11}H_{23})(CH_3)_2N$, $(C_{12}H_{25})(CH_3)_2N$, $(C_{13}H_{27})(CH_3)_2N$, $(C_{14}H_{29})(CH_3)_2N$, $(C_{15}H_{31})(CH_3)_2N$, $(C_{16}H_{33})(CH_3)_2N$, $(C_{17}H_{35})(CH_3)_2N$, $(C_{18}H_{37})(CH_3)_2N$, $C_4F_9NH_2$, $C_4F_9C_2H_4NH_2$, $C_4F_9CH_2NH_2$, $C_5F_{11}NH_2$, $C_5F_{11}C_2H_4NH_2$, $C_5F_{11}CH_2NH_2$, $C_6F_{13}NH_2$, $C_6F_{13}C_2H_4NH_2$, $C_6F_{13}CH_2NH_2$, $C_7F_{15}NH_2$, $C_7F_{15}C_2H_4NH_2$, $C_7F_{15}CH_2NH_2$, $C_8F_{17}NH_2$, $C_8F_{17}C_2H_4NH_2$, $C_8F_{17}CH_2NH_2$ and the like.

A compound represented by the general formula [9] is exemplified by compounds such as $C_5H_{11}COOH$, $C_6H_{13}COOH$, $C_7H_{15}COOH$, $C_8H_{17}COOH$, $C_9H_{19}COOH$, $C_{10}H_{21}COOH$, $C_{11}H_{23}COOH$, $C_{12}H_{25}COOH$, $C_{13}H_{27}COOH$, $C_{14}H_{29}COOH$, $C_{15}H_{31}COOH$, $C_{16}H_{33}COOH$, $C_{17}H_{35}COOH$, $C_{18}H_{37}COOH$, $C_6H_5COOH$, $C_5F_{11}COOH$, $C_6F_{13}COOH$, $C_7F_{15}COOH$, $C_8F_{17}COOH$ and the like, compounds obtained by substituting —COOH group of the above compounds with —COOCH_3 group, —COOC_2H_5 group, —COOC_6H_5 group, —COSH group or —COSCH_3 group, and the like.

In consideration of the compatibility with a substance containing a metal element and the water-repellency-imparting effect on the surface of the metal-based wafer, the particularly preferable examples of the above compounds are $C_5H_{11}COOH$, $C_6H_{13}COOH$, $C_7H_{15}COOH$, $C_8H_{17}COOH$, $C_9H_{19}COOH$, $C_{10}H_{21}COOH$, $C_{11}H_{23}COOH$, $C_{12}H_{25}COOH$, $C_{13}H_{27}COOH$, $C_{14}H_{29}COOH$, $C_{15}H_{31}COOH$, $C_{16}H_{33}COOH$, $C_{17}H_{35}COOH$, $C_{18}H_{37}COOH$, compounds obtained by substituting —COOH group of the above compounds with —COOCH_3 group, —COOC_2H_5 group, —COOC_6H_5 group, —COSH group or —COSCH_3 group, and the like.

A compound represented by the general formula [10] is exemplified by: isocyanate compounds such as $C_2H_5NCO$, $C_3H_7NCO$, $C_4H_9NCO$, $C_5H_{11}NCO$, $C_6H_{13}NCO$, $C_7H_{15}NCO$, $C_8H_{17}NCO$, $C_9H_{19}NCO$, $C_{10}H_{21}NCO$, $C_{11}H_{23}NCO$, $C_{12}H_{25}NCO$, $C_{13}H_{27}NCO$, $C_{14}H_{29}NCO$, $C_{15}H_{31}NCO$, $C_{16}H_{33}NCO$, $C_{17}H_{35}NCO$, $C_{18}H_{37}NCO$, $CF_3NCO$, $CF_3CH_2NCO$, $CF_3C_2H_4NCO$, $C_2F_5NCO$, $C_2F_5CH_2NCO$, $C_2F_5C_2H_4NCO$, $C_3F_7NCO$, $C_3F_7CH_2NCO$, $C_3F_7C_2H_4NCO$, $C_4F_9NCO$, $C_4F_9CH_2NCO$, $C_4F_9C_2H_4NCO$, $C_5F_{11}NCO$, $C_5F_{11}CH_2NCO$, $C_5F_{11}C_2H_4NCO$, $C_6F_{13}NCO$, $C_6F_{13}CH_2NCO$, $C_6F_{13}C_2H_4NCO$, $C_7F_{15}NCO$, $C_7F_{15}CH_2NCO$, $C_7F_{15}C_2H_4NCO$, $C_8F_{17}NCO$, $C_8F_{17}CH_2NCO$, $C_8F_{17}C_2H_4NCO$, $C_2H_4(NCO)_2$, $C_3H_6(NCO)_2$, $C_4H_8(NCO)_2$, $C_5H_{10}(NCO)_2$, $C_6H_{12}(NCO)_2$, $C_7H_{14}(NCO)_2$, $C_8H_{16}(NCO)_2$, $C_9H_{18}(NCO)_2$, $C_{10}H_{20}(NCO)_2$, $C_{11}H_{22}(NCO)_2$, $C_{12}H_{24}(NCO)_2$, $C_{13}H_{26}(NCO)_2$, $C_{14}H_{28}(NCO)_2$, $C_{15}H_{30}(NCO)_2$, $C_{16}H_{32}(NCO)_2$, $C_{17}H_{34}(NCO)_2$, $C_{18}H_{36}(NCO)_2$, $(NCO)C_2H_4NCO$, $(NCO)C_3H_6NCO$, $(NCO)C_4H_8NCO$, $(NCO)C_5H_{10}NCO$, $(NCO)C_6H_{12}NCO$, $(NCO)C_7H_{14}NCO$, $(NCO)C_8H_{16}NCO$, $(NCO)C_9H_{18}NCO$, $(NCO)C_{10}H_{20}NCO$, $(NCO)C_{11}H_{22}NCO$, $(NCO)C_{12}H_{24}NCO$, $(NCO)C_{13}H_{26}NCO$, $(NCO)C_{14}H_{28}NCO$, $(NCO)C_{15}H_{30}NCO$, $(NCO)C_{16}H_{32}NCO$, $(NCO)C_{17}H_{34}NCO$, $(NCO)C_{18}H_{36}NCO$, $C_2H_3(NCO)_3$, $C_3H_5(NCO)_3$, $C_4H_7(NCO)_3$, $C_5H_9(NCO)_3$, $C_6H_{11}(NCO)_3$, $C_7H_{13}(NCO)_3$, $C_8H_{15}(NCO)_3$, $C_9H_{17}(NCO)_3$, $C_{10}H_{19}(NCO)_3$, $C_{11}H_{21}(NCO)_3$, $C_{12}H_{23}(NCO)_3$, $C_{13}H_{25}(NCO)_3$, $C_{14}H_{27}(NCO)_3$, $C_{15}H_{29}(NCO)_3$, $C_{16}H_{31}(NCO)_3$, $C_{17}H_{33}(NCO)_3$, $C_{18}H_{35}(NCO)_3$, $C(NCO)_4$, $(NCO)_2C_2H_2(NCO)_2$, $(NCO)_2C_3H_4(NCO)_2$, $(NCO)_2C_4H_6(NCO)_2$, $(NCO)_2C_5H_8(NCO)_2$, $(NCO)_2C_6H_{10}(NCO)_2$, $(NCO)_2C_7H_{12}(NCO)_2$, $(NCO)_2C_8H_{14}(NCO)_2$, $(NCO)_2C_9H_{16}(NCO)_2$, $(NCO)_2C_{10}H_{18}(NCO)_2$, $(NCO)_2C_{11}H_{20}(NCO)_2$, $(NCO)_2Cl_2H_{22}(NCO)_2$, $(NCO)_2C_{13}H_{24}(NCO)_2$, $(NCO)_2C_{14}H_{26}(NCO)_2$, $(NCO)_2C_{15}H_{28}(NCO)_2$, $(NCO)_2C_{16}H_{30}(NCO)_2$, $(NCO)_2C_{17}H_{32}(NCO)_2$, $(NCO)_2C_{18}H_{34}(NCO)_2$ and the like; compounds obtained by substituting an isocyanate group (—NCO group) of the above isocyanate compounds with —SH group, —CHO group, —CONHOH group or a nitrogen element-containing cyclic structure such as an imidazoline ring (the following [18]) and the like; and the like.

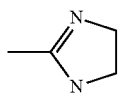

[18]

In consideration of the compatibility with a substance containing a metal element and the water-repellency-imparting effect on the surface of the metal-based wafer, the particularly preferable examples of the above compounds are: isocyanate compounds such as $C_4H_9NCO$, $C_5H_{11}NCO$, $C_6H_{13}NCO$, $C_7H_{15}NCO$, $C_8H_{17}NCO$, $C_9H_{19}NCO$, $C_{10}H_{21}NCO$, $C_{11}H_{23}NCO$, $C_{12}H_{25}NCO$, $C_{13}H_{27}NCO$, $C_{14}H_{29}NCO$, $C_{15}H_{31}NCO$, $C_{16}H_{33}NCO$, $C_{17}H_{35}NCO$, $C_{18}H_{37}NCO$, $C_3F_7CH_2NCO$, $C_3F_7C_2H_4NCO$, $C_4F_9NCO$, $C_4F_9CH_2NCO$, $C_4F_9C_2H_4NCO$, $C_5F_{11}NCO$, $C_5F_{11}CH_2NCO$, $C_5F_{11}C_2H_4NCO$, $C_6F_{13}NCO$, $C_6F_{13}CH_2NCO$, $C_6F_{13}C_2H_4NCO$, $C_7F_{15}NCO$, $C_7F_{15}CH_2NCO$, $C_7F_{15}C_2H_4NCO$, $C_8F_{17}NCO$, $C_8F_{17}CH_2NCO$, $C_8F_{17}C_2H_4NCO$ and the like; compounds obtained by substituting an isocyanate group (—NCO group) of the above isocyanate compounds with —SH group, —CHO group, —CONHOH group or a nitrogen element-containing cyclic structure such as an imidazoline ring and the like; and the like.

A compound represented by the general formula [11] is exemplified by compounds such as $C_4H_4S$, $CH_3C_4H_3S$, $C_2H_5C_4H_3S$, $C_3H_7C_4H_3S$, $C_4H_9C_4H_3S$, $C_5H_{11}C_4H_3S$, $C_6H_{13}C_4H_3S$, $C_7H_{15}C_4H_3S$, $C_8H_{17}C_4H_3S$, $C_9H_{19}C_4H_3S$, $C_{10}H_{24}C_4H_3S$, $C_{11}H_{23}C_4H_3S$, $C_{12}H_{25}C_4H_3S$, $C_{13}H_{27}C_4H_3S$, $C_{14}H_{29}C_4H_3S$, $C_{15}H_{31}C_4H_3S$, $C_{16}H_{33}C_4H_3S$, $C_{17}H_{35}C_4H_3S$, $C_{18}H_{37}C_4H_3S$, $C_3H_3NS$, $CH_3C_3H_2NS$, $C_2H_5C_3H_2NS$, $C_3H_7C_3H_2NS$, $C_4H_9C_3H_2NS$, $C_5H_{11}C_3H_2NS$, $C_6H_{43}C_3H_2NS$, $C_7H_{15}C_3H_2NS$, $C_8H_{17}C_3H_2NS$, $C_9H_{19}C_3H_2NS$, $C_{10}H_{24}C_3H_2NS$, $C_{11}H_{23}C_3H_2NS$, $C_{12}H_{25}C_3H_2NS$, $C_{13}H_{27}C_3H_2NS$, $C_{14}H_{29}C_3H_2NS$, $C_{15}H_{31}C_3H_2NS$, $C_{16}H_{33}C_3H_2NS$, $C_{17}H_{35}C_3H_2NS$, $C_{18}H_{37}C_3H_2NS$ and the like. Incidentally, $C_4H_4S$ represents thiophene, $C_4H_3S$ represents a thiophene ring, $C_3H_3NS$ represents thiazole, and $C_3H_2NS$ represents a thiazole ring.

A compound represented by the general formula [12] is exemplified by compounds such as $CH_3COOCOCH_3$, $C_2H_5COOCOC_2H_5$, $C_3H_7COOCOC_3H_7$, $C_4H_9COOCOC_4H_9$, $C_5H_{11}COOCC_5H_{11}$, $C_6H_{13}COOCOC_6H_{13}$, $C_7H_{15}COOCOC_7H_{15}$, $C_8H_{17}COOCOC_8H_{17}$, $C_9H_{19}COOCOC_9H_{19}$, $C_{10}H_{24}COOCOC_{10}H_{21}$, $C_{11}H_{23}COOCOC_{11}H_{23}$, $C_{42}H_{25}COOCOC_{12}H_{25}$, $C_{13}H_{27}COOCOC_{13}H_{27}$, $C_{14}H_{29}COOCOC_{14}H_{29}$, $C_{15}H_{31}COOCOC_{15}H_{31}$, $C_{16}H_{33}COOCOC_{16}H_{33}$, $C_{17}H_{35}COOCOC_{17}H_{35}$, $C_{18}H_{37}COOCOC_{18}H_{37}$, $C_6H_5COOCOC_6H_5$, $CF_3COOCOCF_3$, $C_2F_5COOCOC_2F_5$, $C_3F_7COOCOC_3F_7$, $C_4F_9COOCOC_4F_9$, $C_5F_{11}COOCOC_5F_{11}$, $C_6F_{13}COOCOC_6F_{13}$, $C_7F_{15}COOCOC_7F_{15}$, $C_8F_{17}COOCOC_8F_{17}$ and the like.

Moreover, it is preferable that a compound selected from compounds represented by the general formulas [6] to [12] and salt compounds thereof has an HLB value (according to Griffin's method) of from 0.001 to 10, because such a compound can impart better water repellency to the surface of the metal-based wafer.

Additionally, it is preferable that a compound selected from compounds represented by the general formulas [6] to [12] and salt compounds thereof is a compound represented by the following general formula [19] or a salt compound thereof, because such a compound can impart better water repellency to the surface of the metal-based wafer.

$$R^{24}-X^{11} \qquad [19]$$

[In the formula [19], $X^{11}$ represents at least one selected from the group consisting of —P(O)(OH)$_2$, —NH$_2$ group, —N=C=O group, —SH group, —CONHOH group and an imidazoline ring. $R^{24}$ represents a $C_4$-$C_{18}$ hydrocarbon group or $C_tF_{2t+1}$—(CH$_2$)$_u$— group (t=4 to 8, u=0 to 2).]

The solvent used in the second process is concretely exemplified by the hydrocarbons, esters, ethers, ketones, halogen element-containing solvents, sulfoxide-based solvents, lactone-based solvents, carbonate-based solvents, polyalcohol derivatives having no OH group and nitrogen element-containing solvents having no N—H group as discussed in the first process. Additionally, it is also possible to cite: water; alcohols such as methanol, ethanol, propanol, butanol, pentanol, hexanol, heptanol, octanol, ethylene glycol, diethylene glycol, 1,3-propanediol, 1,2-propanediol, dipropylene glycol, 1,2-butanediol, 1,3-butanediol, 1,4-butanediol, triethylene glycol, tripropylene glycol, tetraethylene glycol, tetrapropylene glycol, glycerine and the like; polyalcohol derivatives having OH group, such as ethylene glycol monomethyl ether, ethylene glycol monoethyl ether, ethylene glycol monopropyl ether, ethylene glycol monobutyl ether, diethylene glycol monomethyl ether, diethylene glycol monoethyl ether, diethylene glycol monopropyl ether, diethylene glycol monobutyl ether, triethylene glycol monomethyl ether, triethylene glycol monoethyl ether, triethylene glycol monopropyl ether, triethylene glycol monobutyl ether, tetraethylene glycol monomethyl ether, tetraethylene glycol monoethyl ether, tetraethylene glycol monopropyl ether, tetraethylene glycol monobutyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, dipropylene glycol monopropyl ether, dipropylene glycol monobutyl ether, tripropylene glycol monomethyl ether, tripropylene glycol monoethyl ether, tripropylene glycol monopropyl ether, tripropylene glycol monobutyl ether, tetrapropylene glycol monomethyl ether, butylene glycol monomethyl ether and the like; and nitrogen element-containing solvents having N—H group, such as formamide.

Additionally, it is preferable to use a nonflammable one as a part or the entire of the solvent since the water-repellent liquid chemical becomes nonflammable or increases in flash point thereby reducing the risk of the liquid chemical. Most of the halogen element-containing solvents are nonflammable, so that such a halogen element-containing nonflammable solvent can be preferably used as a nonflammable solvent. Furthermore, water can also be used as the nonflammable solvent.

Additionally, in view of safety under the fire protection law, it is preferable to use a solvent having a flash point exceeding 70° C. as the above-mentioned solvent.

Moreover, according to "Globally Harmonized System of Classification and Labelling of Chemicals; GHS", a solvent having a flash point of not higher than 93° C. is defined as "a flammable liquid". Therefore, when a solvent having a flash point exceeding 93° C. is used as the solvent, the water-repellent liquid chemical tends to have a flash point exceeding 93° C. even if the solvent is not nonflammable one. Hence the liquid chemical hardly applies to "a flammable liquid", which is preferable in view of safety.

Additionally, most of the lactone-based solvents, carbonate-based solvents, the polyalcohol derivatives have a high flash point; therefore, it is preferable to use these solvents because the risk of the water-repellent liquid chemical can be reduced. In view of the safety, it is more preferable to use: the solvent as discussed in the first process to have a flash point exceeding 70° C.; or a solvent having a flash point exceeding 70° C. and concretely exemplified by ethylene glycol, diethylene glycol, 1,2-propanediol, 1,3-propanediol, dipropylene glycol, 1,2-butanediol, 1,3-butanediol, 1,4-butanediol, triethylene glycol, tripropylene glycol, tetraethylene glycol, tetrapropylene glycol, glycerine, diethylene glycol monomethyl ether, diethylene glycol monoethyl ether, diethylene glycol monopropyl ether, diethylene glycol monobutyl ether, triethylene glycol monomethyl ether, triethylene glycol monoethyl ether, triethylene glycol monopropyl ether, triethylene glycol monobutyl ether, tetraethylene glycol monomethyl ether, tetraethylene glycol monoethyl ether, tetraethylene glycol monopropyl ether, tetraethylene glycol monobutyl ether, dipropylene glycol monomethyl ether, dipropylene glycol monoethyl ether, dipropylene glycol monopropyl ether, dipropylene glycol monobutyl ether, tripropylene glycol monomethyl ether, tripropylene glycol monoethyl ether, tripropylene glycol monopropyl ether, tripropylene glycol monobutyl ether, tetrapropylene glycol monomethyl ether and the like. It is much more preferable to use: the solvent as discussed in the first process to have a flash point exceeding 93° C.; or a solvent having a flash point exceeding 93° C. and concretely exemplified by ethylene glycol, diethylene glycol, 1,2-propanediol, 1,3-propanediol, dipropylene glycol, 1,2-butanediol, 1,3-butanediol, 1,4-butanediol, triethylene glycol, tripropylene glycol, tetraethylene glycol, tetrapropylene glycol, glycerine, diethylene glycol monomethyl ether, diethylene glycol monopropyl ether, diethylene glycol monobutyl ether, triethylene glycol monomethyl ether, triethylene glycol monoethyl ether, triethylene glycol monopropyl ether, triethylene glycol monobutyl ether, tetraethylene glycol monomethyl ether, tetraethylene glycol monoethyl ether, tetraethylene glycol monopropyl ether, tetraethylene glycol monobutyl ether, dipropylene glycol monopropyl ether, dipropylene glycol monobutyl ether, tripropylene glycol monomethyl ether, tripropylene glycol monoethyl ether, tripropylene glycol monopropyl ether, tripropylene glycol monobutyl ether, tetrapropylene glycol monomethyl ether and the like.

Furthermore, in the water-repellent liquid chemical for metal-based wafers, the concentration of at least one kind of compound selected from the group consisting of compounds represented by the general formulas [6] to [12] and salt compounds thereof is 0.0005 to 2 mass % relative to the total quantity of 100 mass % of the liquid chemical for metal-based wafers. A concentration of smaller than 0.0005 mass % tends to make the water-repellency-imparting effect insufficient, while that of larger than 2 mass % tends to be insoluble in a solvent. A concentration of 0.001 to 1 mass % is more preferable, and 0.0015 to 0.8 mass % is particularly preferable. The liquid chemical for metal-based wafers may contain an organic solvent having a low boiling point, but it is important that a component the amount of which is the largest in mass ratio among components of the water-repellent liquid chemical for metal-based wafers has a boiling point exceeding 40° C. The boiling point is more preferably in excess of 60° C., much more preferably in excess of 80° C.

Furthermore, from reasons of imparting a more excellent water repellency, it is preferable to use hydrocarbons, esters, ethers, ketones, polyalcohol derivatives having no OH group, water or a mixture liquid of these as the solvent for the water-repellent liquid chemical for metal-based wafers. Additionally, in consideration of substitutability with a cleaning liquid and more particularly with a cleaning liquid formed of a water-based liquid, it is preferable to use polyalcohol derivatives having no OH group, water, or a mixture liquid of these.

In the cleaning process of the present invention, the water-repellent liquid chemical, i.e., the water-repellent liquid chemical for silicon-based wafers or the water-repellent liquid chemical for metal-based wafers has a temperature of not lower than 40° C.; therefore, a solvent which may be used for dilution of the liquid chemical preferably has a boiling point of not lower than 40° C. Though a solvent having a boiling point of lower than 40° C. is also acceptable, it is preferable to use another solvent having a boiling point exceeding 40° C., as a component the amount of which is the largest in mass ratio among components of the water-repellent liquid chemical (hereinafter, such a component may be referred to as a primary solvent component). The primary solvent component preferably has a boiling point of not lower than 50° C., particularly preferably not lower than 70° C.

Additionally, the water-repellent liquid chemical for silicon-based wafers may contain an additive and the like in addition to the silicon compound A represented by the general formula [1], acid or base, and a solvent. Furthermore, the water-repellent liquid chemical for metal-based wafers also may contain an additive and the like in addition to at least one kind of compound selected from the group consisting of compounds represented by the general formulas [6] to [12] and salt compounds thereof and a solvent. The additive is exemplified by oxidizing agents such as hydrogen peroxide, ozone and the like; surfactants and the like. Additionally, in a case where the uneven pattern of the wafer has a part formed of a material on which the silicon compound A or any compound represented by the general formulas [6] to [12] cannot form the water-repellent film, an additive capable of forming the water-repellent film on the material may be added. Moreover, concerning the water-repellent liquid chemical for silicon-based wafers, another acid may be added for other purposes than obtaining the silicon compound B.

In the present invention, a style for cleaning the wafer is not particularly limited so long as the water-repellent liquid chemical or the cleaning liquid is retained at least in the recessed portions of the uneven pattern of the wafer. Examples of the style for cleaning the wafer are: a single cleaning style represented by spin cleaning where a generally horizontally held wafer is rotated and cleaned one by one while supplying a liquid to the vicinity of the center of the rotation; and a batch style where a plurality of wafer sheets are immersed in a cleaning bath to be cleaned. Incidentally, the form of the water-repellent liquid chemical or the cleaning liquid at the time of supplying the water-repellent liquid chemical or the cleaning liquid at least to the recessed portions of the uneven pattern of the wafer is not particularly limited as far as it is in a condition of liquid at the time of being retained in the recessed portions. The form is exemplified by liquid, vapor and the like.

In the present invention, the wafer is not particularly limited so long as the wafer has an uneven pattern; however, a wafer containing silicon element at the surfaces of the recessed portions of the uneven pattern or a wafer containing at least one kind of element of titanium, tungsten, aluminum, copper, tin, tantalum and ruthenium at the surfaces of the recessed portions of the uneven pattern is used.

A wafer containing silicon element at the surfaces of the recessed portions of the uneven pattern includes: those in which at least one component selected from silicon, silicon oxide and silicon nitride is formed at least at the surfaces of the recessed portions of the wafer; and those in which at least the surfaces of the recessed portions are formed of at least one component selected from silicon, silicon oxide and silicon nitride at the time of forming the uneven pattern. Additionally, the wafer may include: those in which at least one component selected from silicon, silicon oxide and silicon nitride is formed at least a part of the surfaces of the recessed portions of the wafer; and those in which at least a part of the surfaces of the recessed portions is formed of at least one component selected from silicon, silicon oxide and silicon nitride at the time of forming the uneven pattern. In these cases, the water-repellent film is formed on a surface of at least one component selected from silicon, silicon oxide and silicon nitride which component exists at least at the part of the surfaces of the recessed portions. Accordingly, the water-repellent film may be formed on a part of the surfaces of the recessed portions of the wafer.

The wafer containing at least one kind of element of titanium, tungsten, aluminum, copper, tin, tantalum and ruthenium at the surfaces of the recessed portions of the uneven pattern includes: those obtained by coating a surface of a silicon wafer, a wafer formed of a plurality of components including silicon and/or silicon oxide ($SiO_2$), a silicon carbide wafer, a sapphire wafer, semiconductor wafers formed of various kinds of compound, a plastic wafer or the like with a layer formed of a matter containing titanium element such as titanium, titanium nitride, titanium oxide and the like, a matter containing tungsten element such as tungsten, tungsten oxide and the like, a matter containing aluminum element such as aluminum and aluminum oxide and the like, a matter containing copper element such as copper and copper oxide and the like, a matter containing tin element such as tin and tin oxide and the like, a matter containing tantalum element such as tantalum nitride and tantalum oxide and the like or a matter containing ruthenium element such as ruthenium and ruthenium oxide and the like; those formed having a multilayer film at least one layer of which is a film formed of a matter containing the above-mentioned metal-based elements; and the like. The step of forming the uneven pattern is conducted on a layer including a layer formed of a matter containing the above-mentioned metal-based elements. Additionally, those in which at least a part of the surface of the uneven pattern serves as a matter containing at least one kind element of the above-mentioned metal-based elements at the time of forming the uneven pattern are also included.

Also concerning a wafer formed of a plurality of components that include a matter containing at least one kind of element of the above-mentioned metal-based elements, it is possible to form the water-repellent film on the surface of the matter containing at least one kind of element of the above-mentioned metal-based elements, by using the water-repellent liquid chemical for metal-based wafers. The wafer formed of a plurality of components is exemplified by those in which the matter containing at least one kind of element of the above-mentioned metal-based elements is formed at least at a part of the surfaces of the recessed portions and those in which at least a part of the surfaces of the recessed portions serves as the matter containing at least one kind of element of the above-mentioned metal-based elements at the time of forming the uneven pattern. In the uneven pattern, where the water-repellent liquid chemical for metal-based wafers can form the water-repellent film is a surface of a moiety of the matter containing at least one kind of element of the above-mentioned metal-based elements. Hence the water-repellent film may be formed at least on a part of the surfaces of the recessed portions of the metal-based wafer by using the water-repellent liquid chemical for metal-based wafers.

Additionally, the cleaning process of the present invention particularly preferably includes:

(a step 1) a step of making a surface of a wafer into a surface having an uneven pattern, followed by supplying a water-based liquid to the surface and retaining the water-based liquid at least in recessed portions of the uneven pattern;

(a step 2) a step of substituting the liquid retained at least in the recessed portions of the uneven pattern with a cleaning liquid containing 80 mass % or greater of a solvent having a boiling point of 55 to 200° C.;

(a step 3) a step of substituting the cleaning liquid with a water-repellent liquid chemical and retaining the liquid chemical at least in the recessed portions of the uneven pattern;

(a step 4) a step of removing the liquid from the surfaces of the uneven pattern by drying; and (a step 5) a step of removing a water-repellent film.

First of all, a water-based liquid is retained at least in recessed portions of uneven pattern as discussed in the "step 1". Acid which may be mixed into the water-based liquid is exemplified by inorganic acids and organic acids. Examples of the inorganic acids include hydrogen fluoride, buffered hydrogen fluoride, sulfuric acid, nitric acid, hydrochloric acid, phosphoric acid and the like. Examples of the organic acids include methanesulfonic acid, benzenesulfonic acid, p-toluenesulfonic acid, trifluoromethanesulfonic acid, acetic acid, trifluoroacetic acid, pentafluoropropionic acid and the like. Alkali which may be mixed into a cleaning liquid is exemplified by ammonia, choline and the like. An oxidizing agent which may be mixed into the cleaning liquid are exemplified by ozone, hydrogen peroxide and the like.

Then, the liquid retained in the recessed portions is substituted with a cleaning liquid containing 80 mass % or greater of a solvent having a boiling point of 55 to 200° C. as discussed in the "step 2". Incidentally, the liquid having been retained in the recessed portions before the substitution may be the above-mentioned water-based liquid or an after-mentioned rinsing liquid A.

It is preferable that the cleaning liquid is at least one liquid selected from the group consisting of; organic solvents; water; and aqueous solutions obtained by mixing at least one kind selected from the organic solvents, acids, alkalis and oxidizing agents with water.

In a case of preparing the cleaning liquid containing an organic solvent having a boiling point of lower than 55° C., a mixture liquid obtained by mixing the organic solvent having a boiling point of lower than 55° C. into water or an organic solvent having a boiling point of 55 to 200° C. is arranged to contain a solvent having a boiling point of 55 to 200° C. in an amount of 80 mass % or greater, thereby preparing the cleaning liquid. Additionally, in a case of preparing the cleaning liquid containing an organic solvent having a boiling point exceeding 200° C., a mixture liquid obtained by mixing the organic solvent having a boiling point exceeding 200° C. into water or an organic solvent having a boiling point of 55 to 200° C. is arranged to contain a solvent having a boiling point of 55 to 200° C. in an amount of 80 mass % or greater, thereby preparing the cleaning liquid.

Incidentally, the cleaning liquid is preferably an organic solvent, water, a mixture liquid of water and an organic solvent in view of its cleanliness. Furthermore, it is preferable that the cleaning liquid is an organic solvent since the water-repellent liquid chemical can be supplied to the recessed portions without being brought into contact with water. In particular, the organic solvent preferably contains a water-soluble organic solvent (having a solubility of not smaller than 5 parts by mass relative to 100 parts by mass of water), with which the organic solvent can be easily substituted for the water-based liquid.

Subsequent to the step of retaining the water-based liquid in the recessed portions (the step 1), the water-based liquid retained at least in the recessed portions of the uneven pattern may be substituted with another liquid (hereinafter, it may be referred to as a rinsing liquid A) which is different from the water-based liquid. The step of substitution with the cleaning liquid (the step 2) may be performed thereafter.

Incidentally, it is possible to use two or more liquids for substitution, as the rinsing liquid A. For example, as the rinsing liquid A, substitution may be conducted with water and then with an organic solvent (which preferably includes a water-soluble organic solvent).

Then, the water-repellent liquid chemical is retained at least in the recessed portions of the uneven pattern as discussed in the "step 3", thereby forming the water-repellent film on the surfaces of the recessed portions of the uneven pattern of the wafer by virtue of the water-repellent liquid chemical. The temperature of the water-repellent liquid chemical supplied in the substitution step is not lower than 40° C. and lower than the boiling point of the water-repellent liquid chemical.

When the water-repellent film is formed on the surfaces of the recessed portions of the uneven pattern of the wafer by virtue of the water-repellent liquid chemical, a contact angle read on the assumption that water is retained on the surfaces is preferably from 50 to 130° because the pattern collapse becomes difficult to occur. Additionally, the closer to 90° the contact angle is, the smaller the capillary force acting on the recessed portions becomes. With this, the pattern collapse is made further difficult to occur. Hence it is particularly preferable that the contact angle is from 60 to 120°, much more preferably from 70 to 110°. Furthermore, the capillary force is preferably not higher than 2.1 MN/m². The capillary force of not higher than 2.1 MN/m² is preferable because the pattern collapse becomes difficult to occur thereby. Additionally, a lower capillary force makes the pattern collapse more difficult to occur, so that a capillary force is particularly preferably not higher than 1.5 MN/m², much more preferably not higher than 1.0 MN/m². Furthermore, it is ideal to put the capillary force close to 0.0 MN/m² as much as possible by adjusting the contact angle to the liquid to around 90°.

Then, a step of removing the liquid from the surfaces of the uneven pattern by drying is performed as discussed in the "step 4". In this step, the liquid having been retained on the surfaces of the uneven pattern is removed by drying. The drying is preferably conducted by a conventionally known drying method such as spin drying, IPA (2-propanol) steam drying, Marangoni drying, heating drying, blowing drying, warm air drying, vacuum drying and the like.

Incidentally, subsequent to the step of retaining the water-repellent liquid chemical at least in the recessed portions of the uneven pattern (the step 3), the water-repellent liquid chemical having been retained at least in the recessed portions of the uneven pattern may be substituted with another liquid (hereinafter, it may be referred to as a rinsing liquid B) which is different from the water-repellent liquid chemical. The step of removing the liquid from the surfaces of the uneven pattern by drying (the step 4) may be performed thereafter.

Incidentally, it is possible to use two or more cleaning liquids for substitution, as the rinsing liquid B. For example, as the rinsing liquid B, substitution may be conducted with an organic solvent (which preferably includes a water-soluble organic solvent) and then with a water-based liquid.

The rinsing liquid A and the rinsing liquid B are exemplified by: water; organic solvents; mixtures of water and an organic solvent; these into which at least one kind of an acid, alkali and surfactant is mixed; these into which at least one kind of compound selected from the group which may be used for the water-repellent liquid chemical, i.e, selected from the group consisting of the silicon compound A, the silicon compound A and acid or base, compounds represented by the general formulas [6] to [12] and salt compounds thereof is so mixed that the compound has a lower concentration than the water-repellent liquid chemical; and the like.

Incidentally, the organic solvent discussed as one preferable example of the above-mentioned cleaning liquid, the rinsing liquid A and the rinsing liquid B can be exemplified by hydrocarbons, esters, ethers, ketones, halogen element-containing solvents, sulfoxide-based solvents, alcohols, polyalcohol derivatives, nitrogen element-containing solvents and the like.

Concrete examples of the organic solvent are cited by organic solvents which may be used for dilution of the water-repellent liquid chemical for silicon-based wafers and by the same organic solvents as those used in the water-repellent liquid chemical for metal-based wafers.

When removing a liquid from the surface of the uneven pattern, the liquid having been retained on the surface may be the water-repellent liquid chemical, the rinsing liquid B, or a mixture liquid of these. Incidentally, a mixture liquid containing the water-repellent liquid chemical may be a liquid which is under a condition where the water-repellent liquid chemical is in the process of being substituted with the rinsing liquid B, or may be a mixture liquid obtained by previously mixing the water-repellent liquid chemical into the rinsing liquid B which is different from the water-repellent liquid chemical. Additionally, a liquid may be once removed from the surface of the uneven pattern, followed by retaining the rinsing liquid B or the above-mentioned mixture liquid on the surface of the uneven pattern, upon which drying may be conducted. By virtue of the presence of the water-repellent film on the surfaces of the recessed portions at the time of removing a liquid from the surface of the uneven pattern, the capillary force acting on the recessed portions is so reduced as to make the pattern collapse difficult to occur.

In the step of removing the liquid from the surfaces of the uneven pattern by drying (the step 4), the liquid removed from the surface of the uneven pattern is preferably the rinsing liquid B and more particularly water, the organic solvent or a mixture of these. This is because stains become difficult to remain on the wafer surface after drying. If the liquid is a water-based liquid and more specifically if the liquid is water, the contact angle θ between this liquid and the surfaces of the recessed portions of the uneven pattern provided with water repellency by the water-repellent liquid chemical is increased. This is preferable because the capillary force P acting on the recessed portions is decreased.

Incidentally, the cleaning liquid, the rinsing liquid A and the rinsing liquid B may be retained at a temperature of not lower than 10° C. and lower than the boiling point of the liquid. For example, a solution containing an acid aqueous solution, particularly preferably a solution containing an acid aqueous solution and an organic solvent having a boiling point of not lower than 100° C. is used as the rinsing liquid A, and the temperature of the rinsing liquid A is increased close to the boiling point of the rinsing liquid A. This is preferable because the water-repellent film can be formed with a short time.

Then, the step of removing the water-repellent film is performed as discussed in the "step 5". In the case of removing the water-repellent film, it is effective to cleave a C—C bond and a C—F bond in the water-repellent film. A method therefor is not particularly limited so long as the method can cleave the above-mentioned bonds, but exemplified by a method of irradiating the wafer surface with light, a method of heating the wafer, a method of exposing the wafer to ozone, a method of irradiating the wafer surface with plasma, a method of subjecting the wafer surface to corona discharge and the like.

In the case of removing the water-repellent film by light irradiation, it is preferable to conduct an irradiation with ultraviolet rays having a wavelength of shorter than 340 nm and 240 nm (which are energies corresponding to bond energies of a C—C bond and a C—F bond in the water-repellent film, i.e., 83 kcal/mol and 116 kcal/mol). As the light source therefor, there is used a metal halide lamp, a low-pressure mercury lamp, a high-pressure mercury lamp, an excimer lamp, a carbon arc or the like. In the case of the metal halide lamp, the intensity of the ultraviolet irradiation is preferably not less than 100 mW/cm$^2$, particularly preferably not less than 200 mW/cm$^2$, as a measurement value obtained by the illuminance meter (Intensity meter UM-10 produced by Konica Minolta Sensing, Inc., Light-Receptor UM-360 [Peak sensitivity wavelength: 365 nm, Measured wavelength range: 310 to 400 nm]). Incidentally, an irradiation intensity of less than 100 mW/cm$^2$ takes a long period of time to remove the water-repellent film. Additionally, in the case of the low-pressure mercury lamp, the ultraviolet irradiation is performed with shorter wavelengths so that removal of the water-repellent film is achieved in a short time even with a low intensity; hence this is preferable.

Additionally, in the case of removing the water-repellent film by light irradiation, it is particularly preferable to generate ozone in parallel with decomposition of components of the water-repellent film by ultraviolet rays and then to induce oxidation-volatilization of the components of the water-repellent film by the ozone, since a treatment time is saved thereby. As the light source therefor, the low-pressure mercury lamp or the excimer lamp is used. Additionally, the wafer may be heated while being subjected to light irradiation.

In the case of heating the wafer, the heating of the wafer is conducted at 400 to 700° C., preferably at 500 to 700° C. The heating time therefor is preferably kept from 0.5 to 60 minutes, more preferably from 1 to 30 minutes. Additionally, this step may be conducted in combination with ozone exposure, plasma irradiation, corona discharge or the like. Additionally, the wafer may be heated while being subjected to light irradiation.

In the case of exposing the wafer to ozone, ozone generated by ultraviolet irradiation using the low-pressure mercury lamp, low-temperature discharge using high voltages or the like is preferably supplied to the wafer surface. The wafer may be irradiated with light or heated while being exposed to ozone.

In the step of removing the water-repellent film from the wafer surface, the removal of the water-repellent film formed on the wafer surface can be efficiently achieved by combining the light irradiation, heating, ozone exposure, plasma irradiation, corona discharge and the like.

EXAMPLES

A technique of making a wafer surface into a surface having an uneven pattern has been variously studied and already been established as has been discussed in other literatures and the like. Accordingly, in the present invention, evaluations concerning a surface treatment on a wafer by using the water-repellent liquid chemical were mainly performed. Additionally, as apparent from the following equation, a pattern collapse greatly depends on the contact angle of a retained liquid to the wafer surface, i.e. the contact angle of a liquid drop of the liquid and on the surface tension of the liquid.

$$P = 2 \times \gamma \times \cos \theta / S$$

(In the equation, γ represents the surface tension of a liquid retained in the recessed portions, θ represents the contact angle between the liquid retained in the recessed portions and the surfaces of the recessed portions, and S represents the widths of the recessed portions.)

In a case of a liquid retained in recessed portions 4 of an uneven pattern 2, the contact angle of a liquid drop of the liquid and the capillary force acting on the recessed portions (which force is regarded as being equal to the pattern collapse) are in correlation with each other, so that it is also possible to derive the capillary force from the equation and the evaluations made on the contact angle of the liquid drop to a water-repellent film 12. In Examples, water, which is representative of a water-based liquid, was used as the liquid.

However, in the case of a wafer having an unevenly patterned surface, it is not possible to exactly evaluate the contact angle of the water-repellent film 12 itself formed on the unevenly patterned surface.

An evaluation of the contact angle of waterdrop is conducted by dropping several microliters of waterdrop on a surface of a sample (a substrate) and then by measuring an angle formed between the waterdrop and the substrate surface, as discussed in JIS R 3257 (Testing method of wettability of glass substrate surface). However, in the case of the wafer having a pattern, the contact angle is enormously large. This is because Wenzel's effect or Cassie's effect is caused so that an apparent contact angle of the waterdrop is increased under the influence of a surface shape (roughness) of the substrate upon the contact angle.

In view of the above, in the present examples, a water-repellent liquid chemical is supplied onto a wafer having a smooth surface to form a water-repellent film thereon, the water-repellent film being regarded as the water-repellent film 12 formed on the surface of a wafer 1 having at its surface an uneven pattern 2, thereby performing various evaluations. In the present examples, there were used "a wafer having a thermal oxide film" formed to have a smooth thermal oxide film on a silicon wafer having a smooth surface and "a wafer having a silicon nitride film" formed to have a smooth silicon nitride film on a silicon wafer having a smooth surface, as a silicon-based wafer having a smooth surface. Moreover, there were used "a wafer having a titanium nitride film" formed to have a titanium nitride layer on a silicon wafer having a smooth surface, "a wafer having a tungsten film" formed to have a tungsten layer on a silicon wafer having a smooth surface and "a wafer having a ruthenium film" formed to have a ruthenium layer on a silicon wafer having a smooth surface, as a metal-based wafer having a smooth surface.

In such a cleaning process as to supply liquid to a wafer while rotating the wafer, it is extremely difficult to precisely replicate a condition where the cleaning liquid is substituted with the water-repellent liquid chemical. Hence, in the present example, a wafer that had been immersed in a cleaning liquid was immersed in a water-repellent liquid chemical under a condition where the cleaning liquid is retained on the surface of the wafer, thereby replicating the substitution condition with great accuracy. Additionally, a time for immersion in the water-repellent liquid chemical was variously changed in order to evaluate wafer's water repellency-provided conditions (a condition of a water-repellent film) different in degree of the progress of substitution.

Details will be discussed below. Hereinafter, there will be discussed: a method for evaluating a wafer to which a water-repellent liquid chemical is supplied; preparation of the water-repellent liquid chemical; and results of evaluation made after providing the water-repellent liquid chemical to the wafer.

Method for Evaluating Wafer to which Water-Repellent Liquid Chemical is Provided As a method for evaluating a wafer to which a water-repellent liquid chemical is provided, the following evaluations (1) and (2) were performed.

(1) Evaluation of Contact Angle of Water-Repellent Film Formed on Wafer Surface

About 2 μl of pure water was dropped on a surface of a wafer on which a water-repellent film was formed, followed by measuring an angle (contact angle) formed between the waterdrop and the wafer surface by using a contact angle meter (produced by Kyowa Interface Science Co., Ltd.: CA-X Model). This measurement was conducted at five locations of the wafer surface, followed by calculating a mean value.

(2) Evaluation of Capillary Force

The capillary force (the absolute value of P) was obtained by calculating P by using the following equation.

$$P = 2 \times \gamma \times \cos \theta / S$$

(In the equation, γ represents the surface tension of a liquid retained in the recessed portions, θ represents the contact angle between the liquid retained in the recessed portions and the surfaces of the recessed portions, and S represents the widths of the recessed portions.)

Incidentally, the present example was made on the assumption that a wafer formed having a line-and-space pattern the line width (the width of the recessed portions) of which was 45 nm, as an example of a pattern shape. The pattern having a line width of 45 nm tends to cause its collapse in a case where a cleaning liquid used when a gas-liquid interface passes through the uneven pattern is water, while the pattern collapse tends to be difficult to occur in a case of 2-propanol. When the width of the recessed portions is 45 nm and the wafer surface is silicon oxide, the capillary force in a case where the cleaning liquid is 2-propanol (Surface tension: 22 mN/m, Contact angle to surface of silicon oxide: 1°) is 0.98 MN/m². On the other hand, the capillary force in a case where the cleaning liquid is water (Surface tension: 72 mN/m, Contact angle to silicon oxide: 2.5°) having the largest surface tension among liquids other than mercury is 3.2 MN/m². If the wafer surface is titanium nitride, tungsten or ruthenium, for example, the contact angle of 2-propanol to the surface is 0.5° in all cases, and similarly the contact angle of water is 2° in all cases. Also concerning the other matters containing titanium element, tungsten element or ruthenium element (such as titanium, titanium oxide, tungsten oxide, ruthenium oxide and the like), the degree of the contact angle is as much as the above. In a case of those having the width of the recessed portions of 45 nm, such as a wafer having a titanium nitride film, a wafer having a tungsten film and a wafer having a ruthenium film, the capillary force in a case where the cleaning liquid is 2-propanol (Surface tension: 22 mN/m) is 0.98 MN/m². On the other hand, the capillary force in a case where the cleaning liquid is water (Surface tension: 72 mN/m) having the largest surface tension among liquids other than mercury is 3.2 MN/m².

Example 1-1

(1) Cleaning of Wafer, Using Cleaning Liquid

A wafer having a smooth thermal oxide film (a silicon-based wafer formed having a thermal oxide film of 1 μm thickness on its surface) was immersed in 1 mass % hydrogen fluoride aqueous solution at room temperature for 2 minutes. Thereafter, the wafer was immersed in pure water for 1 minute, and then in 2-propanol (iPA; 82° C. Boiling Point) for 1 minute. Accordingly, a cleaning liquid retained on the surface of the wafer after cleaning is iPA.

(2) Preparation of Water-Repellent Liquid Chemical

In the present example, 5 g of hexamethyldisilazane [(H$_3$O$_3$Si—NH—Si(CH$_3$)$_3$] as a silicon compound A, 0.1 g of trimethylsilyl trifluoroactate [(CH$_3$)$_3$Si—OC(O)CF$_3$] as a silicon compound B, and 94.9 g of propylene glycol monomethyl ether acetate (PGMEA) as an organic solvent were mixed thereby obtaining a water-repellent liquid chemical. Incidentally, a component the amount of which is the largest in mass ratio among components of the water-repellent liquid chemical is PGMEA and its boiling point is 146° C.

(3) Substitution of Cleaning Liquid on Wafer Surface with Water-Repellent Liquid Chemical The water-repellent liquid chemical prepared as discussed in the "(2) Preparation of Water-Repellent Liquid Chemical" section was heated up to 40° C. Then, the wafer having a thermal oxide film, prepared as discussed in the "(1) Cleaning of Wafer, using Cleaning Liquid" section, was immersed in the liquid chemical for various periods of time (5, 10, 20, 30, 40, 50 and 60 seconds) to substitute the cleaning liquid with the liquid chemical, thereby forming a water-repellent film. Subsequently, the wafer having a thermal oxide film was taken out of the liquid chemical, followed by immersing the wafer in iPA serving as a rinsing liquid for 60 seconds and then in pure water for 60 seconds.

(4) Wafer Drying

Finally, the wafer having a thermal oxide film was taken out of the pure water, followed by blowing drying by spraying air thereon, so as to remove the pure water from the surface.

The thus obtained wafer having a thermal oxide film was evaluated in a manner discussed in the [Method for Evaluating Wafer to which Water-Repellent Liquid Chemical is provided] section, in which a surface treatment time (a substitution time) required to provide a contact angle of not smaller than 75°, that of not smaller than 80° and that of not smaller than 85° (in other words, a capillary force of not higher than 0.8 MN/m$^2$, that of not higher than 0.6 MN/m$^2$, and that of not higher than 0.3 MN/m$^2$, respectively) to the wafer having a thermal oxide film after surface treatment was investigated. The Result thereof is shown in Table 1.

is 218° C. Furthermore, PGDA means propylene glycol diacetate; a component the amount of which is the largest in mass ratio among components of the water-repellent liquid chemical using the solvent is PGDA and its boiling point is 190° C. Additionally, PGMEA/DEE means a solvent obtained by mixing PGMEA and diethyl ether (DEE; 35° C. Boiling Point) at a mass ratio of 90:10; a component the amount of which is the largest in mass ratio among components of the water-repellent liquid chemical using the mixture solvent is PGMEA and its boiling point is 146° C. Similarly, PGMEA/DEGEEA means a solvent obtained by mixing PGMEA and DEGEEA at a mass ratio of 90:10; a component the amount of which is the largest in mass ratio among components of the water-repellent liquid chemical using the mixture solvent is PGMEA and its boiling point is 146° C. Similarly, DEGEEA/PGMEA means a solvent obtained by mixing DEGEEA and PGMEA at a mass ratio of 90:10; a component the amount of which is the largest in mass ratio among components of the water-repellent liquid chemical using the mixture solvent is DEGEEA and its boiling point is 218° C.

Example 2-1

The procedure of Example 1-1 was repeated with the exception that 5 g of hexamethyldisilazane [(H$_3$C)$_3$Si—NH—Si(CH$_3$)$_3$] as a silicon compound D, 0.1 g of trifluoro-

TABLE 1

| | Solvent for Water-Repellent Liquid Chemical | Cleaning Liquid used before Water Repellency-Imparting Treatment | | Temperature of Water-Repellent Liquid Chemical (° C.) | Required Time for Surface Treatment (sec) | | |
|---|---|---|---|---|---|---|---|
| | | Kind | Boiling Temperature (° C.) | Temperature (° C.) | | Contact Angle ≥ 75° (Capillary Force ≤ 0.8 MN/m$^2$) | Contact Angle ≥ 80° (Capillary Force ≤ 0.6 MN/m$^2$) | Contact Angle ≥ 85° (Capillary Force ≤ 0.3 MN/m$^2$) |
| Example 1-1 | PGMEA | iPA | 82 | 25 | 40 | 5 | 10 | 10 |
| Example 1-2 | PGMEA | iPA | 82 | 25 | 60 | 5 | 10 | 10 |
| Example 1-3 | PGMEA | iPA | 82 | 25 | 80 | 5 | 10 | 10 |
| Example 1-4 | PGMEA | PGMEA | 146 | 25 | 80 | 5 | 10 | 10 |
| Example 1-5 | DEGEEA | PGMEA | 146 | 25 | 60 | 5 | 10 | 20 |
| Example 1-6 | PGDA | PGMEA | 146 | 25 | 60 | 5 | 10 | 10 |
| Example 1-7 | PGMEA | PGMEA/DEE | 146 | 25 | 60 | 5 | 10 | 10 |
| Example 1-8 | PGMEA | PGMEA/DEGEEA | 146 | 25 | 60 | 5 | 10 | 20 |
| Example 1-9 | PGMEA/DEE | PGMEA | 146 | 25 | 60 | 5 | 10 | 10 |
| Example 1-10 | PGMEA/DEGEEA | PGMEA | 146 | 25 | 60 | 5 | 10 | 10 |
| Comparative Example 1-1 | PGMEA | iPA | 82 | 25 | 25 | 10 | 10 | 20 |
| Comparative Example 1-2 | PGMEA | DEGEEA | 218 | 25 | 60 | 5 | 10 | 20 |
| Comparative Example 1-3 | DEGEEA | DEGEEA | 218 | 25 | 60 | 10 | 20 | 30 |
| Comparative Example 1-4 | PGDA | DEGEEA | 218 | 25 | 60 | 5 | 10 | 20 |
| Comparative Example 1-5 | PGMEA | DEGEEA/PGMEA | 218 | 25 | 60 | 5 | 20 | 30 |

Examples 1-2 to 1-10

Comparative Examples 1-1 to 1-5

Upon modifying those used in Example 1-1 (i.e., the temperature of the water-repellent liquid chemical, the cleaning liquid used before a water-repellency-imparting treatment, and the solvent for the water-repellent liquid chemical), the wafer having a thermal oxide film was subjected to the surface treatment and then evaluated. The results are shown in Table 1. By the way, DEGEEA means diethylene glycol monoethyl ether acetate. A component the amount of which is the largest in mass ratio among components of the water-repellent liquid chemical using the solvent is DEGEEA and its boiling point acetic anhydride [{CF$_3$C(O)}$_2$O] as an acid D and 94.9 g of PGMEA as an organic solvent were mixed and reacted thereby obtaining a water-repellent liquid chemical containing trimethylsilyl trifluoroacetate as the silicon compound B, hexamethyldisilazane as the silicon compound A, and PGMEA as the organic solvent. Incidentally, a component the amount of which is the largest in mass ratio among components of the water-repellent liquid chemical is PGMEA and its boiling point is 146° C. Hexamethyldisilazane contained in the water-repellent liquid chemical of the present Example is the silicon compound D not consumed by the reaction foobtaining the silicon compound B, and this component functions as the silicon compound A. The result is shown in Table 2.

TABLE 2

| | Solvent for Water-Repellent Liquid Chemical | Cleaning Liquid used before Water Repellency-Imparting Treatment | | Temperature of Water-Repellent Liquid Chemical (° C.) | Required Time for Surface Treatment (sec) | | |
|---|---|---|---|---|---|---|---|
| | | Kind | Boiling Temperature (° C.) | Temperature (° C.) | | Contact Angle ≥ 75° (Capillary Force ≤ 0.8 MN/m$^2$) | Contact Angle ≥ 80° (Capillary Force ≤ 0.6 MN/m$^2$) | Contact Angle ≥ 85° (Capillary Force ≤ 0.3 MN/m$^2$) |
| Example 2-1 | PGMEA | iPA | 82 | 25 | 40 | 5 | 10 | 10 |
| Example 2-2 | PGMEA | iPA | 82 | 25 | 60 | 5 | 10 | 10 |
| Example 2-3 | PGMEA | iPA | 82 | 25 | 80 | 5 | 10 | 10 |
| Example 2-4 | PGMEA | PGMEA | 146 | 25 | 60 | 5 | 10 | 10 |
| Example 2-5 | DEGEEA | PGMEA | 146 | 25 | 60 | 5 | 10 | 20 |
| Example 2-6 | PGDA | PGMEA | 146 | 25 | 60 | 5 | 10 | 10 |
| Comparative Example 2-1 | PGMEA | iPA | 82 | 25 | 25 | 10 | 10 | 20 |
| Comparative Example 2-2 | PGMEA | DEGEEA | 218 | 25 | 60 | 5 | 10 | 20 |
| Comparative Example 2-3 | DEGEEA | DEGEEA | 218 | 25 | 60 | 10 | 20 | 30 |
| Comparative Example 2-4 | PGDA | DEGEEA | 218 | 25 | 60 | 5 | 10 | 20 |

Examples 2-2 to 2-6

Comparative Examples 2-1 to 2-4

Upon modifying those used in Example 2-1 (i.e., the temperature of the water-repellent liquid chemical, the cleaning liquid used before a water-repellency-imparting treatment, and the solvent for the water-repellent liquid chemical), the wafer having a thermal oxide film was subjected to the surface treatment and then evaluated. The results are shown in Table 2.

Example 3-1

The procedure of Example 2-1 was repeated with the exception that the acid D was changed to trifluoroacetic acid [CF$_3$C(O)—OH]. Incidentally, a component the amount of which is the largest in mass ratio among components of the water-repellent liquid chemical obtained in the present Example is PGMEA and its boiling point is 146° C. The result is shown in Table 3.

TABLE 3

| | Solvent for Water-Repellent Liquid Chemical | Cleaning Liquid used before Water Repellency-Imparting Treatment | | Temperature of Water-Repellent Liquid Chemical (° C.) | Required Time for Surface Treatment (sec) | | |
|---|---|---|---|---|---|---|---|
| | | Kind | Boiling Temperature (° C.) | Temperature (° C.) | | Contact Angle ≥ 75° (Capillary Force ≤ 0.8 MN/m$^2$) | Contact Angle ≥ 80° (Capillary Force ≤ 0.6 MN/m$^2$) | Contact Angle ≥ 85° (Capillary Force ≤ 0.3 MN/m$^2$) |
| Example 3-1 | PGMEA | iPA | 82 | 25 | 40 | 5 | 10 | 10 |
| Example 3-2 | PGMEA | iPA | 82 | 25 | 60 | 5 | 10 | 10 |
| Example 3-3 | PGMEA | iPA | 82 | 25 | 80 | 5 | 10 | 10 |
| Example 3-4 | PGMEA | PGMEA | 146 | 25 | 60 | 5 | 10 | 10 |
| Example 3-5 | DEGEEA | PGMEA | 146 | 25 | 60 | 5 | 10 | 20 |
| Example 3-6 | PGDA | PGMEA | 146 | 25 | 60 | 5 | 10 | 10 |
| Comparative Example 3-1 | PGMEA | iPA | 82 | 25 | 25 | 10 | 10 | 20 |
| Comparative Example 3-2 | PGMEA | DEGEEA | 218 | 25 | 60 | 5 | 10 | 20 |
| Comparative Example 3-3 | DEGEEA | DEGEEA | 218 | 25 | 60 | 10 | 20 | 30 |
| Comparative Example 3-4 | PGDA | DEGEEA | 218 | 25 | 60 | 5 | 10 | 20 |

Examples 3-2 to 3-6

Comparative Examples 3-1 to 3-4

Upon modifying those used in Example 3-1 (i.e., the temperature of the water-repellent liquid chemical, the cleaning liquid used before a water-repellency-imparting treatment, and the solvent for the water-repellent liquid chemical), the wafer having a thermal oxide film was subjected to the surface treatment and then evaluated. The results are shown in Table 3.

Example 4-1

The procedure of Example 1-1 was repeated with the exception that trimethylsilyl dimethylamine [$(CH_3)_3Si-N(CH_3)_2$] was used as the silicon compound A and that the silicon compound B was not used. Incidentally, a component the amount of which is the largest in mass ratio among components of the water-repellent liquid chemical obtained in the present Example is PGMEA and its boiling point is 146° C. The result is shown in Table 4.

TABLE 4

|  | Solvent for Water-Repellent Liquid Chemical | Cleaning Liquid used before Water Repellency-Imparting Treatment | | Temperature of Water-Repellent Liquid Chemical (° C.) | Required Time for Surface Treatment (sec) | | |
| --- | --- | --- | --- | --- | --- | --- | --- |
|  |  | Kind | Boiling Temperature (° C.) / Temperature (° C.) | | Contact Angle ≥ 75° (Capillary Force ≤ 0.8 MN/m$^2$) | Contact Angle ≥ 80° (Capillary Force ≤ 0.6 MN/m$^2$) | Contact Angle ≥ 85° (Capillary Force ≤ 0.3 MN/m$^2$) |
| Example 4-1 | PGMEA | iPA | 82 / 25 | 40 | 10 | 20 | 60 |
| Example 4-2 | PGMEA | iPA | 82 / 25 | 60 | 5 | 10 | 50 |
| Example 4-3 | PGMEA | iPA | 82 / 25 | 80 | 5 | 10 | 20 |
| Example 4-4 | PGMEA | PGMEA | 146 / 25 | 60 | 5 | 20 | 60 |
| Comparative Example 4-1 | PGMEA | iPA | 82 / 25 | 25 | 30 | >60 | >60 |
| Comparative Example 4-2 | PGMEA | DEGEEA | 218 / 25 | 60 | 50 | >60 | >60 |

Examples 4-2 to 4-4

Comparative Examples 4-1 and 4-2

Upon modifying those used in Example 4-1 (i.e., the temperature of the water-repellent liquid chemical, and the cleaning liquid used before a water-repellency-imparting treatment), the wafer having a thermal oxide film was subjected to the surface treatment and then evaluated. The results are shown in Table 4.

Example 5-1

The procedure of Example 4-1 was repeated with the exception that octyldimethyl(dimethylamino)silane [$C_8H_{17}Si(CH_3)_2-N(CH_3)_2$] was used as the silicon compound A. Incidentally, a component the amount of which is the largest in mass ratio among components of the water-repellent liquid chemical obtained in the present Example is PGMEA and its boiling point is 146° C. The result is shown in Table 5.

TABLE 5

|  | Solvent for Water-Repellent Liquid Chemical | Cleaning Liquid used before Water Repellency-Imparting Treatment | | Temperature of Water-Repellent Liquid Chemical (° C.) | Required Time for Surface Treatment (sec) | | |
| --- | --- | --- | --- | --- | --- | --- | --- |
|  |  | Kind | Boiling Temperature (° C.) / Temperature (° C.) | | Contact Angle ≥ 75° (Capillary Force ≤ 0.8 MN/m$^2$) | Contact Angle ≥ 80° (Capillary Force ≤ 0.6 MN/m$^2$) | Contact Angle ≥ 85° (Capillary Force ≤ 0.3 MN/m$^2$) |
| Example 5-1 | PGMEA | iPA | 82 / 25 | 40 | 20 | 20 | 30 |
| Example 5-2 | PGMEA | iPA | 82 / 25 | 60 | 5 | 10 | 20 |
| Example 5-3 | PGMEA | PGMEA | 146 / 25 | 60 | 10 | 20 | 20 |
| Example 5-4 | DEGEEA | PGMEA | 146 / 25 | 60 | 10 | 20 | 30 |
| Example 5-5 | PGDA | PGMEA | 146 / 25 | 60 | 10 | 10 | 20 |
| Example 5-6 | DPGMEA | PGMEA | 146 / 25 | 60 | 10 | 10 | 20 |
| Example 5-7 | 13BGDA | PGMEA | 146 / 25 | 60 | 10 | 10 | 20 |
| Comparative Example 5-1 | PGMEA | iPA | 82 / 25 | 25 | 60 | >60 | >60 |
| Comparative Example 5-2 | PGMEA | DEGEEA | 218 / 25 | 60 | 20 | 30 | 50 |

Examples 5-2 to 5-7

Comparative Examples 5-1 and 5-2

Upon modifying those used in Example 5-1 (i.e., the temperature of the water-repellent liquid chemical, the cleaning liquid used before a water-repellency-imparting treatment, and the solvent for the water-repellent liquid chemical), the wafer having a thermal oxide film was subjected to the surface treatment and then evaluated. The results are shown in Table 5. By the way, DPGMEA means dipropylene glycol monomethyl ether acetate (Boiling Point; 213° C.), and 13BGDA means 1,3-butylene glycol diacetate (Boiling Point; 232° C.).

Example 6-1

(1) Cleaning of Wafer, Using Cleaning Liquid

A wafer having a smooth silicon nitride film (a silicon-based wafer formed having a silicon nitride layer of 50 nm thickness on its surface) was immersed in 1 mass % hydrogen fluoride aqueous solution at room temperature for 2 minutes. Thereafter, the wafer was immersed in pure water for 1 minute, in a mixture solution containing a 28 mass % aqueous ammonia, a 30 mass % aqueous hydrogen peroxide and water at a volume ratio of 1:1:5 for 1 minute at 70° C., in pure water for 1 minute at room temperature, in iPA for 1 minute, and then in PGMEA (Boiling Point; 146° C.) for 1 minute. Accordingly, a cleaning liquid retained on the surface of the wafer after cleaning is PGMEA.

(2) Preparation of Water-Repellent Liquid Chemical

There were mixed and reacted 5 g of octyldimethyl(dimethylamino)silane [$C_8H_{17}Si(CH_3)_2$—$N(CH_3)_2$] as a silicon compound D, 0.2 g of trifluoroacetic anhydride [$\{CF_3C(O)\}_2O$] as an acid D and 94.8 g of PGMEA as an organic solvent, thereby obtaining a water-repellent liquid chemical containing octyldimethylsilyl trifluoroacetate as a silicon compound B, octyldimethyl(dimethylamino)silane as a silicon compound A, and PGMEA as the organic solvent. Incidentally, a component the amount of which is the largest in mass ratio among components of the water-repellent liquid chemical is PGMEA and its boiling point is 146° C.

By a method similar to that of Example 1-2, the surface of the wafer having a silicon nitride film was treated with the water-repellent liquid chemical, and then evaluated. The result is shown in Table 6.

TABLE 6

| | Solvent for Water-Repellent Liquid Chemical | Cleaning Liquid used before Water Repellency-Imparting Treatment | | Temperature of Water-Repellent Liquid Chemical (° C.) | Required Time for Surface Treatment (sec) | | |
|---|---|---|---|---|---|---|---|
| | | Kind | Boiling Temperature (° C.) | Temperature (° C.) | | Contact Angle ≥ 75° (Capillary Force ≤ 0.8 MN/m$^2$) | Contact Angle ≥ 80° (Capillary Force ≤ 0.6 MN/m$^2$) | Contact Angle ≥ 85° (Capillary Force ≤ 0.3 MN/m$^2$) |
| Example 6-1 | PGMEA | PGMEA | 146 | 25 | 60 | 10 | 20 | 40 |
| Example 6-2 | DEGEEA | PGMEA | 146 | 25 | 60 | 20 | 30 | 50 |
| Example 6-3 | PGDA | PGMEA | 146 | 25 | 60 | 10 | 20 | 40 |
| Example 6-4 | DPGMEA | PGMEA | 146 | 25 | 60 | 10 | 20 | 40 |
| Example 6-5 | 13BGDA | PGMEA | 146 | 25 | 60 | 10 | 20 | 40 |
| Example 6-6 | PGMEA/GBL | PGMEA | 146 | 25 | 60 | 10 | 20 | 40 |
| Comparative Example 6-1 | PGMEA | PGMEA | 146 | 25 | 25 | 60 | >60 | >60 |
| Comparative Example 6-2 | PGMEA | DEGEEA | 218 | 25 | 60 | 20 | >60 | >60 |

Examples 6-2 to 6-6

Comparative Examples 6-1 and 6-2

Upon modifying those used in Example 6-1 (i.e., the temperature of the water-repellent liquid chemical, the cleaning liquid used before a water-repellency-imparting treatment, and the solvent for the water-repellent liquid chemical), the wafer having a silicon nitride film was subjected to the surface treatment and then evaluated. The results are shown in Table 6. By the way, PGMEA/GBL means a mixture solvent obtained by mixing PGMEA and γ-butyrolactone at a mass ratio of 60:40. A component the amount of which is the largest in mass ratio among components of the water-repellent liquid chemical using the mixture solvent is PGMEA and its boiling point is 146° C.

Example 7-1

(1) Cleaning of Wafer, Using Cleaning Liquid

A wafer having a smooth titanium nitride film (a silicon wafer formed having a titanium nitride layer of 50 nm thickness on its surface) was immersed in 1 mass % aqueous hydrogen peroxide at room temperature for 1 minute. Thereafter, the wafer was immersed in pure water for 1 minute, and then in PGMEA (Boiling Point; 146° C.) for 1 minute, at room temperature. Accordingly, a cleaning liquid retained on the surface of the wafer after cleaning is PGMEA.

(2) Preparation of Water-Repellent Liquid Chemical

There were mixed 0.01 g of perfluorohexylethylphosphonic acid [$C_6F_{13}$—$C_2H_4$—$P(O)(OH)_2$] and 99.99 g of a mixture solvent (PGMEA:iPA=99.89:0.1 (mass ratio)) as a solvent, followed by stirring for 18 hours, thereby obtaining a water-repellent liquid chemical. Incidentally, a component the amount of which is the largest in mass ratio among components of the water-repellent liquid chemical is PGMEA and its boiling point is 146° C.

By a method similar to that of Example 1-2, the surface of the wafer having a titanium nitride film was treated with the water-repellent liquid chemical, and then evaluated. The result is shown in Table 7.

TABLE 7

| | Solvent for Water-Repellent Liquid Chemical | Cleaning Liquid used before Water Repellency-Imparting Treatment | | Temperature of Water-Repellent Liquid Chemical (° C.) | Required Time for Surface Treatment (sec) | | |
|---|---|---|---|---|---|---|---|
| | | Kind | Boiling Temperature (° C.) | Temperature (° C.) | | Contact Angle ≥ 75° (Capillary Force ≤ 0.8 MN/m$^2$) | Contact Angle ≥ 80° (Capillary Force ≤ 0.6 MN/m$^2$) | Contact Angle ≥ 85° (Capillary Force ≤ 0.3 MN/m$^2$) |
| Example 7-1 | PGMEA/iPA | PGMEA | 146 | 25 | 60 | 5 | 5 | 5 |
| Example 7-2 | DEGEEA/iPA | PGMEA | 146 | 25 | 60 | 5 | 5 | 5 |
| Example 7-3 | PGDA/iPA | PGMEA | 146 | 25 | 60 | 5 | 5 | 5 |
| Example 7-4 | DPGMEA/iPA | PGMEA | 146 | 25 | 60 | 5 | 5 | 5 |
| Example 7-5 | 13BGDA/iPA | PGMEA | 146 | 25 | 60 | 5 | 5 | 5 |
| Comparative Example 7-1 | PGMEA/iPA | PGMEA | 146 | 25 | 25 | 5 | 5 | 10 |
| Comparative Example 7-2 | PGMEA/iPA | DEGEEA | 218 | 25 | 60 | 5 | 5 | 10 |

Examples 7-2 to 7-5

Comparative Examples 7-1 and 7-2

Upon modifying those used in Example 7-1 (i.e., the temperature of the water-repellent liquid chemical, the cleaning liquid used before a water-repellency-imparting treatment, and the solvent for the water-repellent liquid chemical), the wafer having a titanium nitride film was subjected to the surface treatment and then evaluated. The results are shown in Table 7. By the way, DEGEEA/iPA means a mixture solvent obtained by mixing DEGEEA and iPA at a mass ratio of 99.89:0.1; a component the amount of which is the largest in mass ratio among components of the water-repellent liquid chemical using the mixture solvent is DEGEEA and its boiling point is 218° C. Additionally, PGDA/iPA means a mixture solvent obtained by mixing PGDA and iPA at a mass ratio of 99.89:0.1; a component the amount of which is the largest in mass ratio among components of the water-repellent liquid chemical using the mixture solvent is PGDA and its boiling point is 190° C. Additionally, DPGMEA/iPA means a mixture solvent obtained by mixing DPGMEA and iPA at a mass ratio of 99.89:0.1; a component the amount of which is the largest in mass ratio among components of the water-repellent liquid chemical using the mixture solvent is DPGMEA and its boiling point is 213° C. Additionally, 13BGDA/iPA means a mixture solvent obtained by mixing 13BGDA and iPA at a mass ratio of 99.89:0.1; a component the amount of which is the largest in mass ratio among components of the water-repellent liquid chemical using the mixture solvent is 13BGDA and its boiling point is 232° C.

Example 8-1

The procedure of Example 7-1 was repeated with the exception that 0.01 g of octylphosphonic acid [$C_8H_{17}$—P(O)(OH)$_2$] and 99.99 g of a mixture solvent (PGMEA:iPA=99.89:0.1 (mass ratio)) as the solvent were mixed and then stirred for 18 hours, thereby obtaining a water-repellent liquid chemical. Incidentally, a component the amount of which is the largest in mass ratio among components of the water-repellent liquid chemical obtained in the present Example is PGMEA and its boiling point is 146° C. The result is shown in Table 8.

TABLE 8

| | Solvent for Water-Repellent Liquid Chemical | Cleaning Liquid used before Water Repellency-Imparting Treatment | | Temperature of Water-Repellent Liquid Chemical (° C.) | Required Time for Surface Treatment (sec) | | |
|---|---|---|---|---|---|---|---|
| | | Kind | Boiling Temperature (° C.) | Temperature (° C.) | | Contact Angle ≥ 75° (Capillary Force ≤ 0.8 MN/m$^2$) | Contact Angle ≥ 80° (Capillary Force ≤ 0.6 MN/m$^2$) | Contact Angle ≥ 85° (Capillary Force ≤ 0.3 MN/m$^2$) |
| Example 8-1 | PGMEA/iPA | PGMEA | 146 | 25 | 60 | 5 | 5 | 10 |
| Example 8-2 | DEGEEA/iPA | PGMEA | 146 | 25 | 60 | 5 | 5 | 10 |
| Example 8-3 | PGDA/iPA | PGMEA | 146 | 25 | 60 | 5 | 5 | 10 |
| Example 8-4 | DPGMEA/iPA | PGMEA | 146 | 25 | 60 | 5 | 5 | 10 |
| Comparative Example 8-1 | DEGEEA/iPA | PGMEA | 146 | 25 | 25 | 10 | 20 | 30 |
| Comparative Example 8-2 | DEGEEA/iPA | DEGEEA | 218 | 25 | 60 | 5 | 20 | 30 |

Examples 8-2 to 8-4

Comparative Examples 8-1 and 8-2

Upon modifying those used in Example 8-1 (i.e., the temperature of the water-repellent liquid chemical, the cleaning liquid used before a water-repellency-imparting treatment, and the solvent for the water-repellent liquid chemical), the wafer having a titanium nitride film was subjected to the surface treatment and then evaluated. The results are shown in Table 8.

Example 9-1

The procedure of Example 7-1 was repeated with the exception that a wafer having a smooth tungsten film (a silicon wafer formed having a tungsten layer of 50 nm thickness on its surface) was prepared and immersed in 5 mass % aqueous ammonia for 1 minute at room temperature and that the wafer was subsequently immersed in pure water for 1 minute and then in PGMEA (Boiling Point; 146° C.) for 1 minute, at room temperature, followed by surface treatment. Accordingly, a cleaning liquid retained on the surface of the wafer after cleaning is PGMEA. The result is shown in Table 9.

Examples 9-2 to 9-4

Comparative Examples 9-1 to 9-3

Upon modifying those used in Example 9-1 (i.e., the temperature of the water-repellent liquid chemical, the cleaning liquid used before a water-repellency-imparting treatment, and the solvent for the water-repellent liquid chemical), the wafer having a tungsten film was subjected to the surface treatment and then evaluated. The results are shown in Table 9.

Example 10-1

The procedure of Example 7-1 was repeated with the exception that a wafer having a smooth ruthenium film (a silicon wafer formed having a ruthenium layer of 300 nm thickness on its surface) was prepared and immersed in 5 mass % aqueous ammonia for 1 minute at room temperature and that the wafer was subsequently immersed in pure water for 1 minute and then in PGMEA (Boiling Point; 146° C.) for 1 minute, at room temperature, followed by surface treatment. Accordingly, a cleaning liquid retained on the surface of the wafer after cleaning is PGMEA. The result is shown in Table 10.

TABLE 9

| | Solvent for Water-Repellent Liquid Chemical | Cleaning Liquid used before Water Repellency-Imparting Treatment | | Temperature of Water-Repellent Liquid Chemical (° C.) | Required Time for Surface Treatment (sec) | | |
|---|---|---|---|---|---|---|---|
| | | Kind | Boiling Temperature (° C.) | Temperature (° C.) | | Contact Angle ≥ 60° (Capillary Force ≤ 1.8 MN/m$^2$) | Contact Angle ≥ 70° (Capillary Force ≤ 1.1 MN/m$^2$) | Contact Angle ≥ 85° (Capillary Force ≤ 0.6 MN/m$^2$) |
| Example 9-1 | PGMEA/iPA | PGMEA | 146 | 25 | 60 | 10 | 60 | >60 |
| Example 9-2 | DEGEEA/iPA | PGMEA | 146 | 25 | 60 | 20 | 60 | >60 |
| Example 9-3 | PGDA/iPA | PGMEA | 146 | 25 | 60 | 10 | 60 | >60 |
| Example 9-4 | DPGMEA/iPA | PGMEA | 146 | 25 | 60 | 20 | 60 | >60 |
| Comparative Example 9-1 | PGMEA/iPA | PGMEA | 146 | 25 | 25 | 60 | >60 | >60 |
| Comparative Example 9-2 | PGMEA/iPA | DEGEEA | 218 | 25 | 60 | 60 | >60 | >60 |
| Comparative Example 9-3 | DEGEEA/iPA | DEGEEA | 218 | 25 | 60 | 60 | >60 | >60 |

TABLE 10

| | Solvent for Water-Repellent Liquid Chemical | Cleaning Liquid used before Water Repellency-Imparting Treatment | | Temperature of Water-Repellent Liquid Chemical (° C.) | Required Time for Surface Treatment (sec) | | |
|---|---|---|---|---|---|---|---|
| | | Kind | Boiling Temperature (° C.) | Temperature (° C.) | | Contact Angle ≥ 75° (Capillary Force ≤ 0.8 MN/m$^2$) | Contact Angle ≥ 80° (Capillary Force ≤ 0.6 MN/m$^2$) | Contact Angle ≥ 85° (Capillary Force ≤ 0.3 MN/m$^2$) |
| Example 10-1 | PGMEA/iPA | PGMEA | 146 | 25 | 60 | 20 | 40 | 60 |
| Example 10-2 | DEGEEA/iPA | PGMEA | 146 | 25 | 60 | 20 | 40 | 60 |
| Example 10-3 | PGDA/iPA | PGMEA | 146 | 25 | 60 | 20 | 40 | 60 |
| Example 10-4 | DPGMEA/iPA | PGMEA | 146 | 25 | 60 | 20 | 40 | 60 |
| Example 10-5 | 13BGDA/iPA | PGMEA | 146 | 25 | 60 | 20 | 40 | 60 |
| Comparative Example 10-1 | PGMEA/iPA | PGMEA | 146 | 25 | 25 | >60 | >60 | >60 |

TABLE 10-continued

| | Solvent for Water-Repellent Liquid Chemical | Cleaning Liquid used before Water Repellency-Imparting Treatment | | Temperature of Water-Repellent Liquid Chemical (° C.) | Required Time for Surface Treatment (sec) | | |
|---|---|---|---|---|---|---|---|
| | | Kind | Boiling Temperature (° C.) | Temperature (° C.) | | Contact Angle ≥ 75° (Capillary Force ≤ 0.8 MN/m²) | Contact Angle ≥ 80° (Capillary Force ≤ 0.6 MN/m²) | Contact Angle ≥ 85° (Capillary Force ≤ 0.3 MN/m²) |
| Comparative Example 10-2 | PGMEA/iPA | DEGEEA | 218 | 25 | 60 | 40 | 60 | 60 |
| Comparative Example 10-3 | DEGEEA/iPA | DEGEEA | 218 | 25 | 60 | 40 | 60 | 60 |

Examples 10-2 to 1-5

Comparative Examples 10-1 to 10-3

Upon modifying those used in Example 10-1 (i.e., the temperature of the water-repellent liquid chemical, the cleaning liquid used before a water-repellency-imparting treatment, and the solvent for the water-repellent liquid chemical), the wafer having a ruthenium film was subjected to the surface treatment and then evaluated. The results are shown in Table 10.

Examples were performed by providing the cleaning liquid used before the water-repellency-imparting treatment with a boiling point of from 55 to 200° C. and by providing the water-repellent liquid chemical with a temperature of not lower than 40° C. and lower than the boiling point of the water-repellent liquid chemical. In the present example, it was confirmed that water repellency can be provided after a short time. On the contrary, it was confirmed from Comparative Examples that it took time to provide water repellency. In Comparative Examples, time to achieve the substitution of the cleaning liquid with the liquid chemical was so long as to need an additional time to increase the temperature of the liquid chemical, even if formation of the water-repellent film was accelerated by increasing the temperature of the liquid chemical by conducting an annealing treatment upon completing the substitution; therefore, it was not possible to provide water repellency in such a short time as Examples. Additionally, some examples in which the temperature of the water-repellent liquid chemical was more increased were confirmed to provide water repellency with shorter times.

EXPLANATION OF REFERENCE NUMERALS

1 Wafer
2 Uneven pattern of a surface of the wafer
3 Projected portions of the pattern
4 Recessed portions of the pattern
5 Widths of the recessed portions
6 Heights of the projected portions
7 Widths of the projected portions
8 Cleaning liquid
9 Water-repellent liquid chemical
10 State where the cleaning liquid and the water-repellent liquid chemical are mixed
11 State where the cleaning liquid is evaporating
12 Water-repellent film

What is claimed is:

1. A process for cleaning a wafer having an uneven pattern at its surface, comprising at least the steps of:

cleaning the wafer with a cleaning liquid;
substituting the cleaning liquid retained in recessed portions of the wafer with a water-repellent liquid chemical after cleaning; and
drying the wafer,
wherein the cleaning liquid comprises 80 mass % or greater of a solvent having a boiling point of 55 to 200° C., and
wherein the water-repellent liquid chemical supplied in the substitution step has a temperature of not lower than 40° C. and lower than a boiling point of the water-repellent liquid chemical thereby imparting water repellency at least to surfaces of the recessed portions,
wherein the wafer contains a silicon element at the surfaces of the recessed portions,
wherein the water-repellent liquid chemical is one containing a silicon compound A of general formula [1]

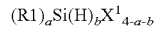

$$(R1)_a Si(H)_b X^1_{4-a-b} \qquad [1]$$

wherein $R^1$ mutually independently represents a monovalent organic group having a $C_1$-$C_{18}$ monovalent hydrocarbon group the hydrogen elements of which may partially or entirely be replaced with a fluorine element(s);
$X^1$ mutually independently represents at least one group selected from the group consisting of monovalent functional group of which element to be bonded to a silicon element is nitrogen, a monovalent functional group of which element to be bonded to a silicon element is oxygen, a halogen group, nitrile group and —CO—NH—Si(CH$_3$)$_3$ group;
a is an integer of from 1 to 3;
b is an integer of from 0 to 2;
the total of a and b is 1 to 3;
or wherein the water-repellent liquid chemical is one containing a silicon compound A and an acid or a base; and
wherein the boiling point of a component the amount of which is the largest in mass ratio among components of the water-repellent liquid chemical is not less than the boiling point of the cleaning liquid.

2. A process for cleaning a wafer, as claimed in claim 1, wherein the cleaning liquid is at least one liquid selected from the group consisting of organic solvents, water, and aqueous solutions obtained by mixing at least one kind selected from the organic solvents, acids, alkalis and oxidizing agents with water.

3. A process for cleaning a wafer, as claimed in claim 1, wherein the water-repellent liquid chemical contains
at least one acid selected from the group consisting of hydrogen chloride, sulfuric acid, perchloric acid, phosphoric acid, alkyl borate ester, aryl borate ester, boron tris(trifluoroacetate), trialkoxyboroxin, boron trifluoride, a sulfonic acid of general formula [2] and its anhydride, $$R^2S(O)_2OH \qquad [2],$$

wherein $R^2$ represents a $C_1$-$C_{18}$ monovalent hydrocarbon group the hydrogen elements of which may partially or entirely be replaced with a fluorine element(s), a carboxylic acid of general formula [3] and its anhydride, $$R^3COOH \qquad [3],$$

wherein $R^3$ represents a $C_1$-$C_{18}$ monovalent hydrocarbon group the hydrogen elements of which may partially or entirely be replaced with a fluorine element(s);

and a silicon compound B represented by general formula [4], $$(R^4)_cSi(H)_dX^2_{4-c-d} \qquad [4],$$

wherein $R^4$ mutually independently represents a $C_1$-$C_{18}$ monovalent hydrocarbon group the hydrogen elements of which may partially or entirely be replaced with a fluorine element(s);

c is an integer of from 1 to 3;

d is an integer of from 0 to 2;

the total of c and d is 1 to 3; and $X^2$ mutually independently represents at least one group selected from the group consisting of chloro, —OCO—$R^5$ and —OS(O)$_2$—$R^6$; wherein $R^5$ is a $C_1$-$C_{18}$ monovalent hydrocarbon group the hydrogen elements of which may partially or entirely be replaced with a fluorine element(s); and $R^6$ is a $C_1$-$C_{18}$ monovalent hydrocarbon group the hydrogen elements of which may partially or entirely be replaced with a fluorine element(s).

4. A process for cleaning a wafer, as claimed in claim 1, wherein the acid is at least one selected from the group consisting of trimethylsilyl trifluoroacetate, trimethylsilyl trifluoromethanesulfonate, dimethylsilyl trifluoroacetate, dimethylsilyl trifluoromethanesulfonate, butyldimethylsilyl trifluoroacetate, butyldimethylsilyl trifluoromethanesulfonate, hexyldimethylsilyl trifluoroacetate, hexyldimethylsilyl trifluoromethanesulfonate, octyldimethylsilyl trifluoroacetate, octyldimethylsilyl trifluoromethanesulfonate, decyldimethylsilyl trifluoroacetate, decyldimethylsilyl trifluoromethanesulfonate, dodecyldimethylsilyl trifluoroacetate and dodecyldimethylsilyl trifluoromethanesulfonate.

5. A process for cleaning a wafer, as claimed in claim 1, wherein the silicon compound A is at least one selected from the group consisting of hexamethyldisilazane, trimethylsilyl dimethylamine, trimethylsilyl diethylamine, tetramethyldisilazane, dimethylsilyl dimethylamine, dimethylsilyl diethylamine, 1,3-dibutyltetramethyldisilazane, butyldimethylsilyl dimethylamine, butyldimethylsilyl diethylamine, 1,3-dihexyltetramethyldisilazane, hexyldimethylsilyl dimethylamine, hexyldimethylsilyl diethylamine, 1,3-dioctyltetramethyldisilazane, octyldimethylsilyl dimethylamine, octyldimethylsilyl diethylamine, 1,3-didecyltetramethyldisilazane, decyldimethylsilyl dimethylamine, decyldimethylsilyl diethylamine, 1,3-didodecyltetramethyldisilazane, dodecyldimethylsilyl dimethylamine and dodecyldimethylsilyl diethylamine.

6. A process for cleaning a wafer, as claimed in claim 1, wherein the water-repellent liquid chemical contains at least one base selected from the group consisting of ammonia, N,N,N',N'-tetramethylethylenediamine, triethylenediamine, dimethylaniline, alkylamine, dialkylamine, trialkylamine, pyridine, piperazine, and N-alkylmorpholine and a silicon compound C represented by general formula [5]

$$(R^7)_eSi(H)_fX^3_{4-e-f} \qquad [5],$$

wherein $R^7$ mutually independently represents a $C_1$-$C_{18}$ monovalent hydrocarbon group the hydrogen elements of which may partially or entirely be replaced with a fluorine element(s);

$X^3$ mutually independently represents a monovalent functional group of which element to be bonded to a silicon element is nitrogen, the monovalent functional group possibly containing a fluorine element or a silicon element;

e is an integer of from 1 to 3;

f is an integer of from 0 to 2; and the total of e and f is 1 to 3.

7. A process for cleaning a wafer, as claimed in claim 1, wherein the water-repellent liquid chemical supplied in the substitution step has a temperature of not lower than 70° C. and lower than a temperature represented by (the boiling point of the water-repellent liquid chemical—10° C.).

8. A process for cleaning a wafer having an uneven pattern at its surface, comprising at least the steps of:

cleaning the wafer with a cleaning liquid;

substituting the cleaning liquid retained in recessed portions of the wafer with a water-repellent liquid chemical after cleaning; and drying the water, wherein the cleaning liquid comprises 80 mass % or greater of a solvent having a boiling point of 55 to 200° C., and wherein the water-repellent liquid chemical supplied in the substitution step has a temperature of not lower than 40° C. and lower than a boiling point of the water-repellent liquid chemical thereby imparting water repellency at least to surfaces of the recessed portions, wherein the wafer is a wafer containing at least one kind of element of titanium, tungsten, aluminum, copper, tin, tantalum and ruthenium at the surface of the recessed portions, and wherein the water-repellent liquid chemical contains at least one kind selected from the group consisting of compounds represented by general formula [6]

$$R^8—P(=O)—(OH)_g(R^9)_{2-g} \qquad [6],$$

wherein $R^8$ represents a $C_1$-$C_{18}$ monovalent hydrocarbon group the hydrogen elements of which may partially or entirely be replaced with a fluorine element(s), $R^9$ mutually independently represents a monovalent organic group having a $C_1$-$C_{18}$ hydrocarbon group the hydrogen elements of which may partially or entirely be replaced with a fluorine element(s), and g is an integer of from 0 to 2;

general formula [7]

$$R^{10}—C(=O)—X^4 \qquad [7]$$

wherein $R^{10}$ represents a monovalent organic group having a $C_1$-$C_{18}$ hydrocarbon group, or a monovalent organic group having a $C_1$-$C_8$ fluoroalkyl chain, and $X^4$ represents a group selected from the group consisting of a fluoro group, chloro group, bromo group and iodo group;

general formula [8]

$$R^{11}R^{12}R^{13}N \quad [8]$$

wherein $R^{11}$ represents a monovalent organic group having a $C_1$-$C_{18}$ hydrocarbon group, or a monovalent organic group having a $C_1$-$C_8$ fluoroalkyl chain, $R^{12}$ represents a hydrogen element, a monovalent organic group having a $C_1$-$C_{18}$ hydrocarbon group, or a monovalent organic group having a $C_1$-$C_8$ fluoroalkyl chain, and $R^{13}$ represents a hydrogen element, a monovalent organic group having a $C_1$-$C_{18}$ hydrocarbon group, or a monovalent organic group having a $C_1$-$C_8$ fluoroalkyl chain;

general formula [9]

$$R^{14}-C(=O)-X^5-X^6 \quad [9]$$

wherein $R^{14}$ represents a monovalent organic group having a $C_1$-$C_{18}$ hydrocarbon group, or a monovalent organic group having a $C_1$-$C_8$ fluoroalkyl chain, $X^5$ represents an oxygen element or sulfur element, $X^6$ represents a group selected from the group consisting of a hydrogen element, alkyl group, aromatic group, pyridyl group, quinolyl group, succinimide group, maleimide group, benzoxazole group, benzothiazole group and benzotriazole group; a hydrogen element(s) of these groups may be substituted with an organic group;

general formula [10]

$$R^{15}(X^7)_h \quad [10]$$

wherein $X^7$ mutually independently represents at least one group selected from the group consisting of an isocyanate group, mercapto group, aldehyde group, —CONHOH group and a cyclic structure containing a nitrogen element, h is an integer of from 1 to 6, $R^{15}$ represents an organic group having a $C_1$-$C_{18}$ hydrocarbon group, or an organic group having a $C_1$-$C_8$ fluoroalkyl chain formed by substituting the "h" number of group(s) selected from an isocyanate group, mercapto group, aldehyde group, —CONHOH group and cyclic structure containing a nitrogen element for the same number of hydrogen element(s);

general formula [11]

$$R^{16}-X^8 \quad [11]$$

wherein $X^8$ represents a cyclic structure containing a sulfur element, $R^{16}$ represents a hydrogen element, a monovalent organic group having a $C_1$-$C_{18}$ hydrocarbon group, or a monovalent organic group having a $C_1$-$C_8$ fluoroalkyl chain; and general formula [12]

$$R^{17}-C(=O)-X^9-C(=O)-R^{18} \quad [12]$$

wherein $R^{17}$ represents a monovalent organic group having a $C_1$-$C_{18}$ hydrocarbon group, or a monovalent organic group having a $C_1$-$C_8$ fluoroalkyl chain, $R^{18}$ represents a monovalent organic group having a $C_1$-$C_{18}$ hydrocarbon group, or a monovalent organic group having a $C_1$-$C_8$ fluoroalkyl chain, and $X^9$ represents an oxygen element or a sulfur element;

and salt compounds thereof and a solvent.

* * * * *